(12) United States Patent
Ohara et al.

(10) Patent No.: US 7,595,506 B2
(45) Date of Patent: Sep. 29, 2009

(54) LIQUID CRYSTAL DISPLAY DEVICE AND DISPLAY DEVICE

(75) Inventors: Ken Ohara, Chiba (JP); Jun Ooida, Mobara (JP); Hiroshi Saito, Fujisawa (JP); Yoshiaki Nakayoshi, Ooamishirasato (JP)

(73) Assignee: Hitachi Displays, Ltd., Chiba (JP)

( * ) Notice: Subject to any disclaimer, the term of this patent is extended or adjusted under 35 U.S.C. 154(b) by 233 days.

(21) Appl. No.: 11/375,108

(22) Filed: Mar. 15, 2006

(65) Prior Publication Data

US 2006/0220024 A1    Oct. 5, 2006

(30) Foreign Application Priority Data

Mar. 17, 2005    (JP) .............................. 2005-076935

(51) Int. Cl.
*H01L 29/06*    (2006.01)
(52) U.S. Cl. .................... 257/72; 257/59; 257/E33.001; 349/129
(58) Field of Classification Search ................. 257/184, 257/187, 203, 221, 291, 257, 290, 292, 293, 257/433, 461, 462, 929, 59–72; 349/129
See application file for complete search history.

(56) References Cited

U.S. PATENT DOCUMENTS

| | | | |
|---|---|---|---|
| 5,712,510 A * | 1/1998 | Bui et al. ..................... 257/758 |
| 6,765,637 B2 | 7/2004 | Takenaka | |
| 6,960,787 B2 * | 11/2005 | Yamazaki et al. ............. 257/59 |
| 7,106,405 B2 | 9/2006 | Okumura | |
| 2004/0011991 A1 | 1/2004 | Markle | |

* cited by examiner

*Primary Examiner*—Wai-Sing Louie
*Assistant Examiner*—Tifney L Skyles
(74) *Attorney, Agent, or Firm*—Stites & Harbison, PLLC; Juan Carlos A. Marquez, Esq.

(57) ABSTRACT

The present invention provides a technique which can make an image quality on a screen of a TFT liquid crystal display device uniform. A liquid crystal display device includes a TFT substrate on which TFT circuits are arranged in an array, a counter substrate which is arranged to face a surface of the TFT substrate on which the TFTs are formed, and a liquid crystal material which is filled between the TFT substrate and the counter substrate, wherein in the TFT substrate, assuming a film thickness and a width of a conductive film of the gate electrode lines in a first region thereof as GLD1 and GLW1 respectively, and a film thickness and a width of a conductive film of the gate electrode lines in a second region thereof which differs from the first region as GLD2 and GLW2 respectively, when the relationship GLD1<GLD2 is established, the relationship GLW1>GLW2 is established.

20 Claims, 22 Drawing Sheets

$GLW1 \times GLD1 \fallingdotseq GLW2 \times GLD2$

LIQUID CRYSTAL DISPLAY DEVICE AND DISPLAY DEVICE

BACKGROUND OF THE INVENTION

1. Field of the Invention

The present invention relates to a liquid crystal display device, and more particularly to a technique which is effectively applicable to a large-screen or high-definition liquid crystal display device.

2. Description of Related Arts

Conventionally, a liquid crystal display device has been used as various display devices including a display of a personal computer or a television receiver set.

The liquid crystal display device is a device which displays an image (a video image) by applying an electric field to a liquid crystal material which is filled between two sheets of glass substrates and controlling the orientation of liquid crystal molecules in the liquid crystal material so as to control the transmission or interruption of light.

Further, although the liquid crystal display device is classified into various kinds depending on the difference in the orientation of the liquid crystal molecules or the difference in method for applying an electric field, recently, a TFT liquid crystal display device which exhibits a high expression ability of natural colors and can easily achieve the acceleration of a response speed has been popularly used.

The TFT liquid crystal display device is a liquid crystal display device which fills a liquid crystal material between a TFT substrate which arranges TFT elements on a glass substrate in an array and a counter substrate which arranges color filters or the like on a surface which faces a surface of the TFT substrate on which the TFT elements are formed.

Here, in the TFT substrate, for example, gate electrode lines, data electrode lines, drain electrodes, gate insulating films, amorphous silicon (a-Si) films and display electrodes are formed on a glass substrate, and TFT (Thin-Film Transistor) elements each of which is constituted of the gate electrode line, a drain electrode which is branched from the data electrode line, a source electrode, the gate insulating film and the amorphous silicon film are arranged in an array.

Further, in manufacturing the TFT substrate, for example, first of all, a conductive film for forming the gate electrode lines is formed on the glass substrate. An etching resist for forming a pattern is formed on a conductive film and, thereafter, unnecessary portions of the conductive film are removed thus forming the gate electrode lines. Thereafter, in the same manner as steps for forming the gate electrode lines, data electrode lines and the like are formed by repeating a series of treatments such as the formation of a film, the formation of a resist and etching.

Further, in the manufacture of the TFT substrate, in a step for forming the etching resist, conventionally, a resist material is applied to the conductive film, and a resist pattern is formed by the exposure treatment using a mask.

However, the method which performs the exposure using the mask uses a preliminarily designed mask size and hence, for example, when the conductive film for forming the gate electrode lines is formed, even when irregularities exist in film thickness, the gate electrode lines are always formed with a fixed width. Recently, a screen of the liquid crystal display device becomes large-sized and hence, at the time of forming the conductive film, the irregularities in film thickness are liable to be easily generated. Accordingly, when the gate electrode lines are formed with the preliminarily designed width as in the case of the prior art, at the time of forming the conductive film, the difference between a cross-sectional area of the gate electrode line in a region where the film thickness is decreased and a cross-sectional area of the gate electrode line in a region where the film thickness is increased becomes large. As a result, the irregularities of the line resistance of the respective gate electrode lines are increased and hence, there has been a drawback that an image quality of an image (a video image) which is displayed by the liquid crystal display device becomes non-uniform in the inside of a screen, that is, regions having a favorable image quality and regions having a poor image quality are generated in the inside of the screen.

To avoid the occurrence of these drawbacks, conventionally, for example, by taking the irregularities of a film thickness and the width of the conductive film for the gate electrode lines into consideration, to set the line resistance of the gate electrode lines to a fixed value or less in the whole region above the TFT substrate, the film thickness of the conductive film is increased or the width of the gate electrode line is increased. However, when the width of the gate electrode line is increased, a numerical aperture, that is, an area which allows the transmission of light from a backlight and the display of colors is decreased corresponding to the increase of the width of the gate electrode line thus giving rise to a drawback that the luminance is lowered and the performance of the liquid crystal display device is lowered. Further, when the film thickness of the conductive film is increased, a film forming time is increased corresponding to the increased thickness of the conductive film and, at the same time, a quantity of conductor material to be used is increased. Accordingly, there also arises a drawback that a manufacturing cost of the TFT substrate (the liquid crystal display device) is pushed up.

SUMMARY OF THE INVENTION

The drawback that the present invention intends to overcome is a point that, as explained in conjunction with the background of the present invention, in the conventional TFT liquid crystal display device, the irregularities of the line resistance of the gate electrode lines on the TFT substrate are large and hence, the image quality on the screen becomes non-uniform.

Further, the conventional TFT liquid crystal display device also has the drawback that when the width of the gate electrode line is increased to decrease the irregularities of the line resistance of the gate electrode lines on the TFT substrate, the numerical aperture is decreased thus lowering the performance of the liquid crystal display device.

It is an object of the present invention to provide a technique which can make an image quality on a screen of a TFT liquid crystal display device uniform.

It is another object of the present invention to provide a technique which can prevent the lowering of luminance and can enhance the performance of the TFT liquid crystal display device while making an image quality on a screen of the TFT liquid crystal display device uniform.

The above-mentioned and other objects and novel features of the present invention will become apparent from the description of the specification and attached drawings.

A TFT liquid crystal display device of the present invention includes: a TFT substrate which forms gate electrode lines, data electrode lines, source electrodes, gate insulating films, amorphous silicon (a-Si) films and display electrodes on a transparent substrate, the TFT substrate further including TFTs which are arranged in an array, wherein each TFT includes the gate electrode line, a drain electrode which is branched from the data electrode line, the source electrode, the gate insulating film and the amorphous silicon film, a counter substrate which is arranged to face a surface of the TFT substrate on which the TFTs are formed, and a liquid crystal material which is filled between the TFT substrate and the counter substrate, wherein in the TFT substrate, assuming a film thickness and a width of a conductive film of the gate electrode lines in a first region thereof as GLD1 and GLW1 respectively, and a film thickness and a width of a conductive film of the gate electrode lines in a second region thereof which differs from the first region as GLD2 and GLW2 respectively, when the relationship GLD1<GLD2 is established, the relationship GLW1>GLW2 is established.

In the TFT liquid crystal display device of the present invention, when the film thickness GLD1 of the conductive film of the gate electrode lines in the first region is smaller than the film thickness GLD2 of the conductive film of the gate electrode lines in the second region, the width GLW1 of the gate electrode lines in the first region is larger than the film thickness GLD2 of the conductive film of the gate electrode lines in the second region. Accordingly, the difference between a cross-sectional area GLD1×GLW1 of the gate electrode line in the first region and a cross-sectional area GLD2×GLW2 of the gate electrode line in the second region becomes smaller compared to the conventional TFT liquid crystal display device and hence, the irregularities of the line resistance for every gate electrode line is reduced. As a result, the irregularities of image quality on a screen can be reduced and made uniform.

Further, with respect to the relationship which is established when the film thickness and the width of the conductive film of the gate electrode lines in the first region are set as GLD1 and GLW1 respectively and the film thickness and the width of the conductive film of the gate electrode lines in the second region are set as GLD2 and GLW2 respectively, it is sufficient so long as the above-mentioned relationship is satisfied. Particularly, it is preferable that the cross-sectional area GLD1×GLW1 of the gate electrode line in the first region and the cross-sectional area GLD2×GLW2 of the gate electrode line in the second region are made equal to each other.

Further, such a TFT substrate can be manufactured using a method which directly depicts a pattern based on numerical data such as CAD layout data or the like, for example. Here, a conductive film for forming the gate electrode lines is formed on a transparent substrate and, thereafter, for example, the film thickness distribution of the conductive film is measured, and based on the result of measurement, the above-mentioned numeral value data is corrected so as to increase the width of the region having the small film thickness and to decrease the width of the region having the large film thickness. Then, when the etching resist is formed on the conductive film, the pattern may be directly drawn based on the corrected numerical data. Due to such a constitution, it is possible to make the cross-sectional area GLD×GLW of all gate electrode lines on the TFT substrate uniform. Accordingly, the line resistance of the respective gate electrode lines can be made uniform thus realizing the uniform image quality. Further, by performing such a correction, different from the prior art, it is no more necessary to increase the film thickness of the conductive film or increase the width of the gate electrode lines such that the line resistance of the gate electrode lines assumes a fixed value or below over the whole region of the TFT substrate whereby the lowering of the performance of the liquid crystal display device can be prevented.

According to another aspect of the present invention, there is provided a display device in which a plurality of first electrode lines such as gate electrode lines, for example, and a plurality of second electrode lines such as data electrode lines, for example, which are arranged above the plurality of first electrode lines in a state that the second electrode lines intersect the first electrode lines by way of an insulating film such as a gate insulating film, for example, are arranged on the substrate and a rectangular display region is formed by the plurality of first electrode lines and the plurality of second electrode lines, wherein at three arbitrary portions on the display region where the first electrode line and the second electrode line intersect each other, assuming a film thickness and a width of a conductive film of the first electrode line in the first portion as t1 and w1, a film thickness and a width of a conductive film of the first electrode line in the second portion as t2 and w2, and a film thickness and a width of a conductive film of the first electrode line in the third portion as t3 and w3, when the film thickness relationship of t1>t2>t3 is established, the width relationship of w1<w2<w3 is established.

Such a constitution can be realized by a manufacturing method adopted by embodiments described later, and the display panel having such a relationship can reduce the image quality irregularities.

In this case, it is desirable that a product of t1 and w1, a product of t2 and w2, and a product of t3 and w3 become equal to each other.

Hereinafter, the present invention is explained in detail in conjunction with embodiments by reference to attached drawings.

Here, in all drawings for explaining the embodiments, parts having identical functions are given same symbols and the repeated explanation is omitted.

DETAILED DESCRIPTION OF THE INVENTION

In a liquid crystal display device of the present invention, with respect to gate electrode lines of a TFT substrate on which TFT circuits are arranged in an array, assuming a film thickness and a width of a conductive film of gate electrode lines in a first region as GLD1 and GLW1, and a film thickness and a width of a conductive film of the gate electrode lines in a second region which is different from the first region as GLD2 and GLW2, when the relationship GLD1<GLD2 is established, the relationship GLW1>GLW2 is established thus making a cross sectional area GLD1×GLW1 of the gate electrode line in the first region and a cross sectional area GLD2×GLW2 of the gate electrode line in the second region substantially equal to each other whereby the irregularities of the line resistance of the respective gate electrode lines are decreased.

Figure 1:
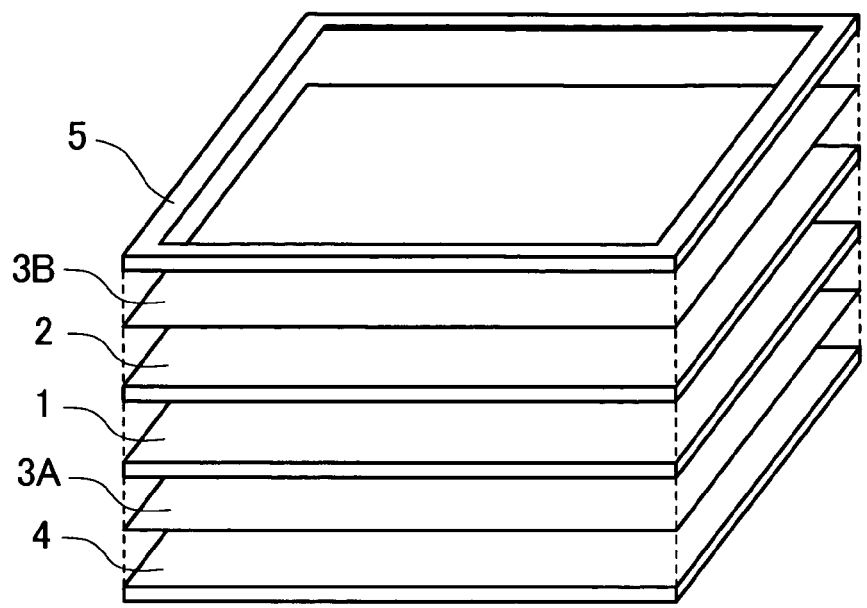
FIG. 1 is a schematic view showing the schematic constitution of a liquid crystal display device according to the present invention and also is a perspective view showing a constitutional example of the whole liquid crystal display device.
Figure 2:
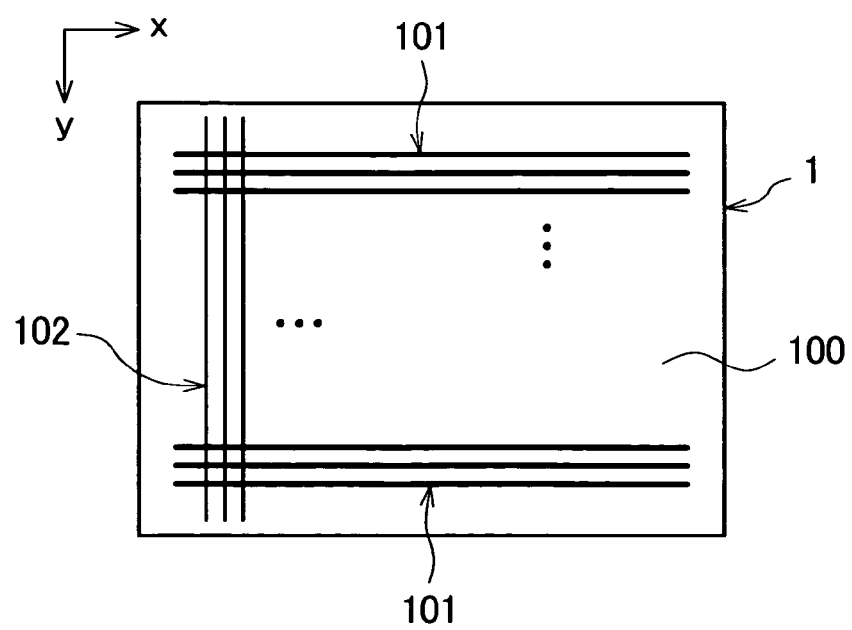
FIG. 2 is a schematic view showing the schematic constitution of a liquid crystal display device according to the present invention and also is a plan view showing the schematic constitution of a TFT substrate.
Figure 3:
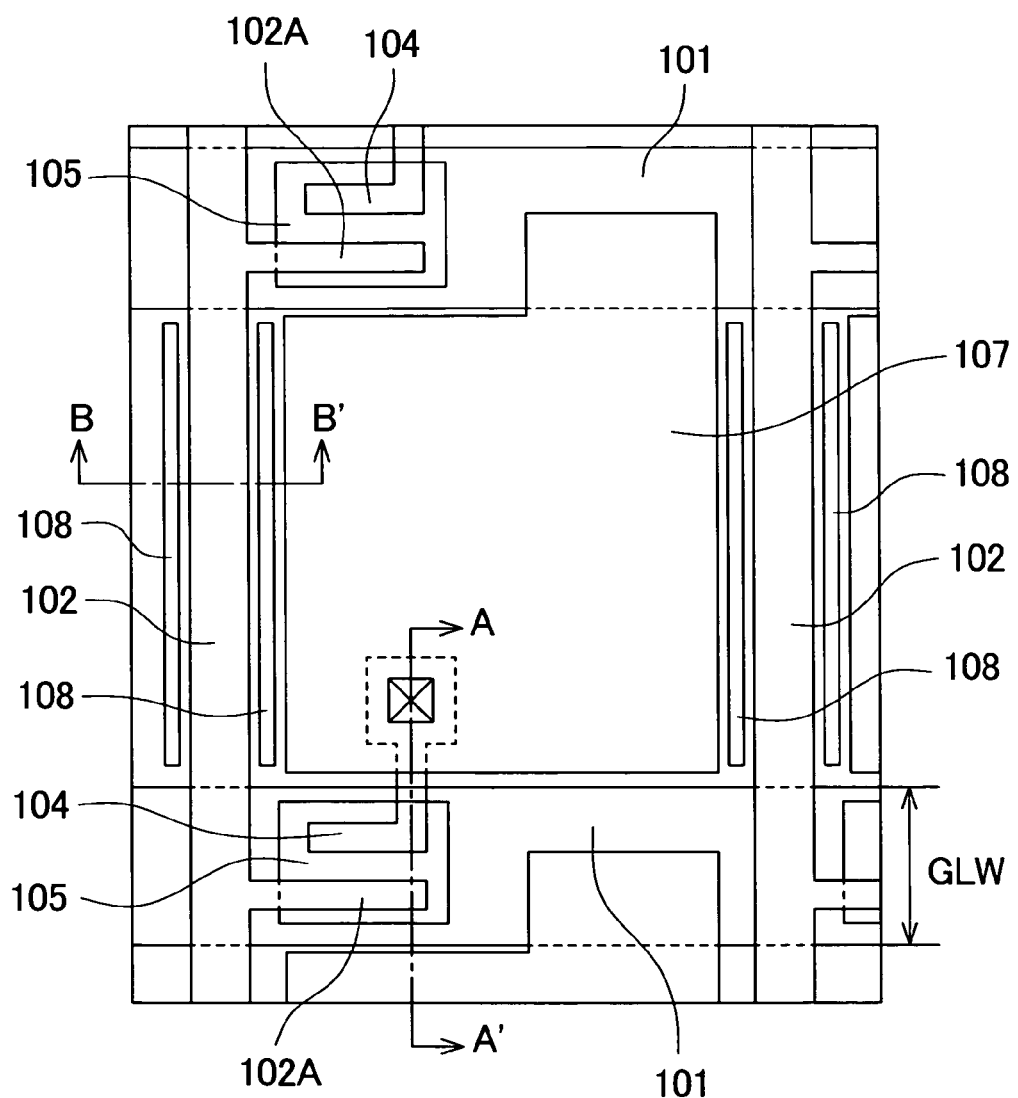
FIG. 3 is a schematic view showing the schematic constitution of a liquid crystal display device according to the present invention and also is a plan view showing a constitutional example of one pixel on the TFT substrate shown in FIG. 2.
Figure 4:
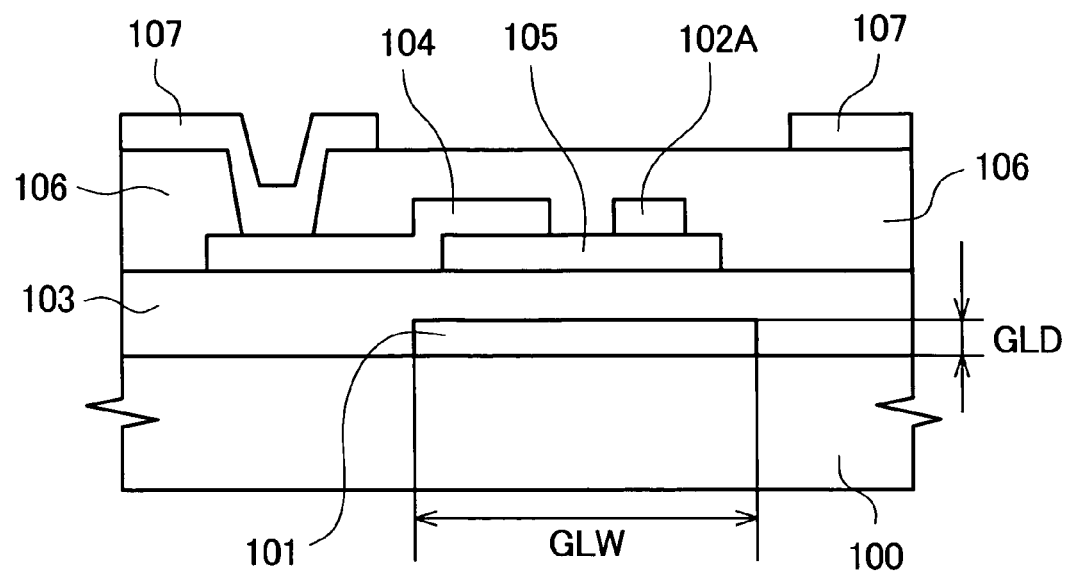
FIG. 4 is a schematic view showing the schematic constitution of a liquid crystal display device according to the present invention and also is a cross-sectional view taken along a line A-A' in FIG. 3.
Figure 5:
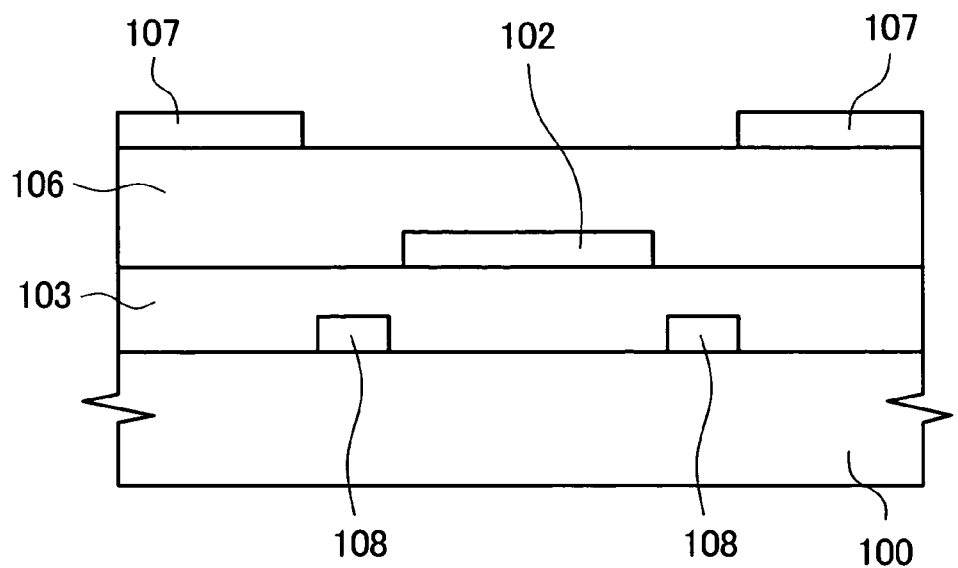
FIG. 5 is a schematic view showing the schematic constitution of a liquid crystal display device according to the present invention and also is a cross-sectional view taken along a line B-B' in FIG. 3.

FIG. 1 to FIG. 5 are schematic views showing the schematic constitution of the liquid crystal display device according to the present invention. FIG. 1 is a perspective view showing a constitutional example of the whole liquid crystal display device. FIG. 2 is a plan view showing the schematic constitution of a TFT substrate. FIG. 3 is a plan view showing a constitutional example of one pixel on the TFT substrate shown in FIG. 2. FIG. 4 is a cross-sectional view taken along a line A-A' in FIG. 3. FIG. 5 is a cross-sectional view taken along a line B-B' in FIG. 3. In the FIG. 4 and FIG. 5 which are cross-sectional views, hatching which serves to express a cross section is omitted.

The liquid crystal display device of the present invention is a TFT liquid crystal display device, wherein the liquid crystal display device is, for example, as shown in FIG. 1, constituted of a TFT substrate 1, a counter substrate 2, polarizers 3A, 3B, a backlight unit 4, and a frame 5.

The TFT substrate 1 is a substrate which arranges TFT circuits on a transparent substrate such as a glass substrate in an array. For example, as shown in FIG. 2, a plurality of gate electrode lines 101 which extend in the x direction of the transparent substrate 100 and a plurality of data electrode lines 102 which extend in the y direction are formed on the transparent substrate 100. Here, to focus on one pixel on the TFT substrate 1, for example, as shown in FIG. 3 to FIG. 5, the gate electrode lines 101 are formed on the transparent substrate 100, a data electrode line 102, a source electrode 104, amorphous silicon (a-Si) film 105 and the like are formed on the gate electrode line 101 by way of an interlayer insulating film 103 which functions as a gate insulating film. Further, a TFT element is constituted of the gate electrode line 101, a drain electrode 102A which is blanched from the data electrode line 102, the source electrode 104, the amorphous silicon film 105 and the gate insulating film 103. Here, the source electrode 104 is connected with a display electrode 107 made of ITO or the like via the interlayer insulating film 106. Further, on the transparent substrate 100, as shown in FIG. 3 and FIG. 5, a shield electrode line 108 which extends along the data electrode line 102 is provided. Further, on the TFT substrate 1, a large number of pixels having the constitution shown in FIG. 3 to FIG. 5 are arranged in an array.

Further, the counter substrate 2 is, for example, a substrate which forms color filters on a transparent substrate such as a glass substrate, and is arranged to face a surface of the TFT substrate 1 on which the TFT elements are formed in an opposed manner. Here, although omitted from the drawing, the TFT substrate 1 and the counter substrate 2 are held at a preliminarily fixed distance using spacers or the like, and a liquid crystal material is filled between the TFT substrate 1 and the counter substrate 2.

Further, two polarizers 3A, 3B which are arranged to sandwich the TFT substrate 1 and the counter substrate 2 are provided for preventing light from the backlight unit 4 from being radiated to the outside in a state that an electric field is not applied to the liquid crystal material, for example.

Further, claim 5 is a member which integrally holds the TFT substrate 1, the counter substrate 2, the polarizers 3A, 3B and the backlight unit 4.

Further, in the liquid crystal display device of the present invention, cross-sectional areas of the gate electrode lines 101 on the TFT substrate, that is, products GLD×GLW of the film thickness GLD and the width GLW of the gate electrode lines 101 shown in FIG. 3 and FIG. 4 are set substantially equal to each other on the whole region of the TFT substrate 1. Hereinafter, embodiments related to the constitution of the TFT substrate 1 used in the liquid crystal display device are explained.

Embodiments

Figure 6:
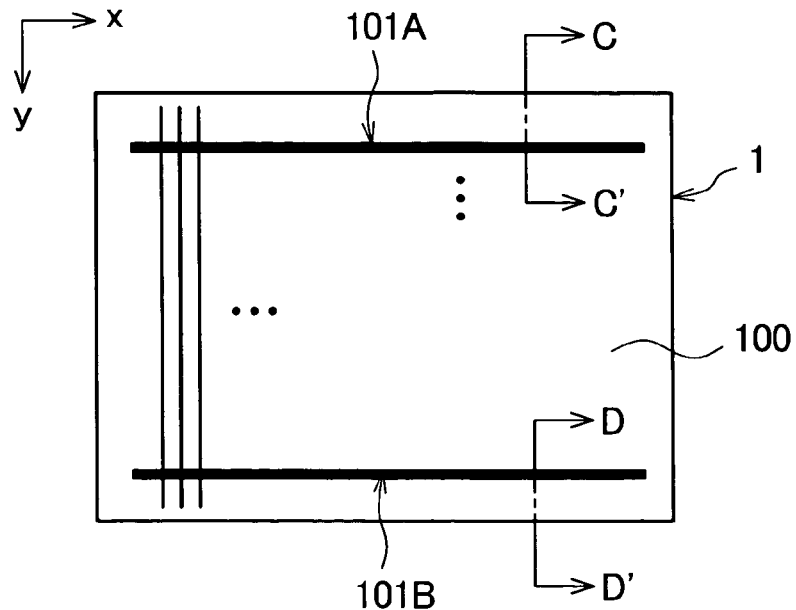
FIG. 6 is a schematic view showing the schematic constitution of the TFT substrate of one embodiment according to the present invention and also is a plan view for explaining the characteristics of the TFT substrate of this embodiment.
Figure 7:
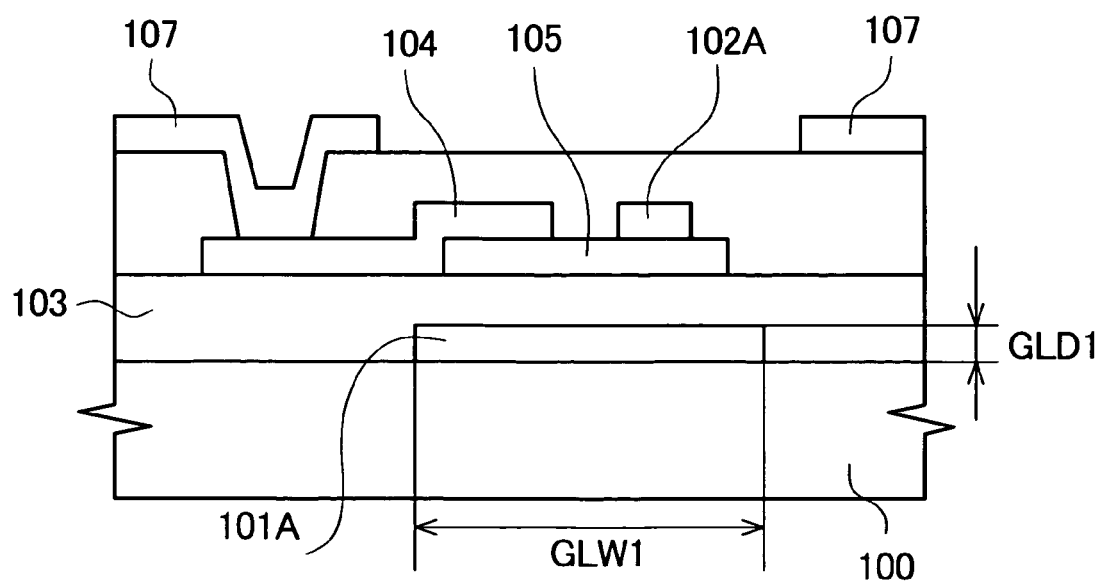
FIG. 7 is a schematic view showing the schematic constitution of the TFT substrate of one embodiment according to the present invention and also is a cross-sectional view taken along a line C-C' in FIG. 6.
Figure 8:
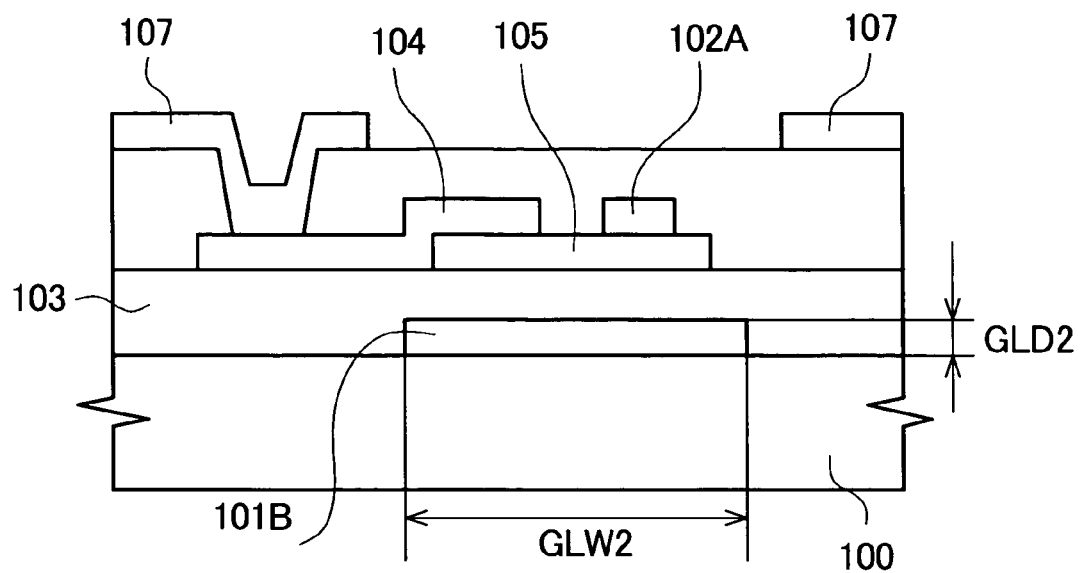
FIG. 8 is a schematic view showing the schematic constitution of a TFT substrate of one embodiment according to the present invention and also is a cross-sectional view taken along a line D-D' in FIG. 6.

FIG. 6 to FIG. 8 are schematic views for explaining the schematic constitution of the TFT substrate of one embodiment according to the present invention. FIG. 6 is a plan view for explaining the feature of the TFT substrate of this embodiment. FIG. 7 is a cross-sectional view taken along a line C-C' in FIG. 6, and FIG. 8 is a cross-sectional view taken along a line D-D' in FIG. 6. Here, in FIG. 7 and FIG. 8 which are cross-sectional views, hatching which serves to express a cross section is omitted. Further, FIG. 7 and FIG. 8 which are cross-sectional views respectively show a cross section of only a periphery of one gate electrode line.

The TFT substrate 1 of this embodiment has the constitution shown in FIG. 2 to FIG. 5, wherein the TFT elements are arranged on the transparent substrate 100 in an array. Further, the liquid crystal display device which uses the TFT substrate 1 of this embodiment has the constitution shown in FIG. 1.

In the TFT substrate 1 of this embodiment, for example, as shown in FIG. 6 to FIG. 8, to compare a film thickness GLD1 of a gate electrode line (hereinafter, referred to as a first gate electrode line) 101A and a film thickness GLD2 of a second gate electrode line 101B which differs from the first gate electrode line 101A, the relationship GLD1<GLD2 may be established. Here, to compare a width GLW1 of the first gate electrode line 101A and a width GLW2 of a second gate electrode line 101B, as shown in FIG. 7 and FIG. 8, the relationship GLW1>GLW2 is established.

Here, when a cross-sectional area GLD1×GLW1 of the first gate electrode line 101A and a cross-sectional area GLD2×GLW2 of the second gate electrode line 101B are equal to each other, the line resistance of the first gate electrode line 101A and the line resistance of the second gate electrode line 101B become equal to each other. Accordingly, when the relationship of the film thickness and the width of respective gate electrode lines can be controlled such that the cross-sectional area GLD×GLW becomes equal with respect to all gate electrode lines on the TFT substrate 1, it is possible to make the line resistances of all gate electrode lines 101 equal. Accordingly, the liquid crystal display device which uses such a TFT substrate 1 can make the image quality on the screen uniform.

Figure 9:
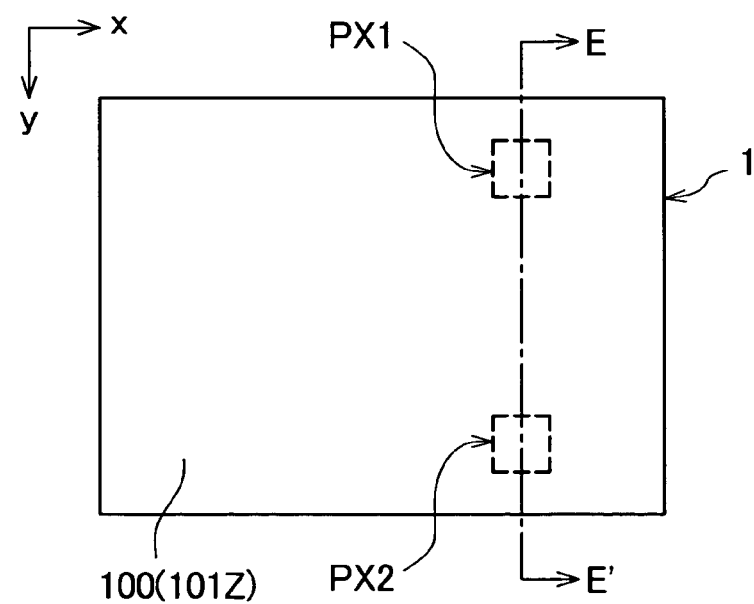
FIG. 9 is a schematic view for explaining one example of a manufacturing method of the TFT substrate of this embodiment and also is a plan view of a step for forming a conductive film for forming gate electrode lines.
Figure 10:
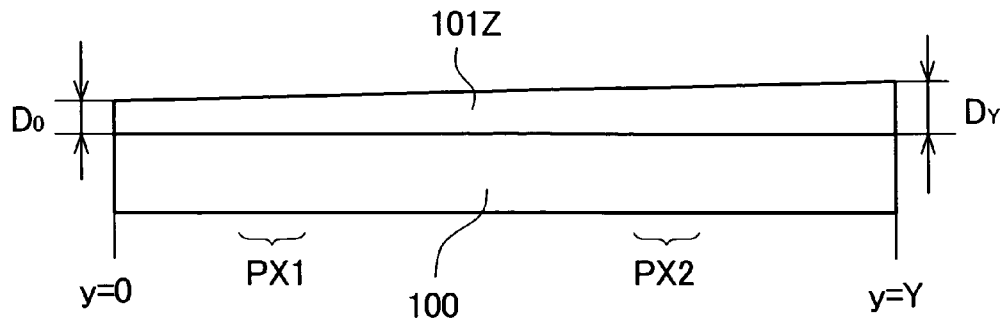
FIG. 10 is a schematic view for explaining one example of a manufacturing method of the TFT substrate of this embodiment and also is a cross-sectional view taken along a line E-E' in FIG. 9.
Figure 11:
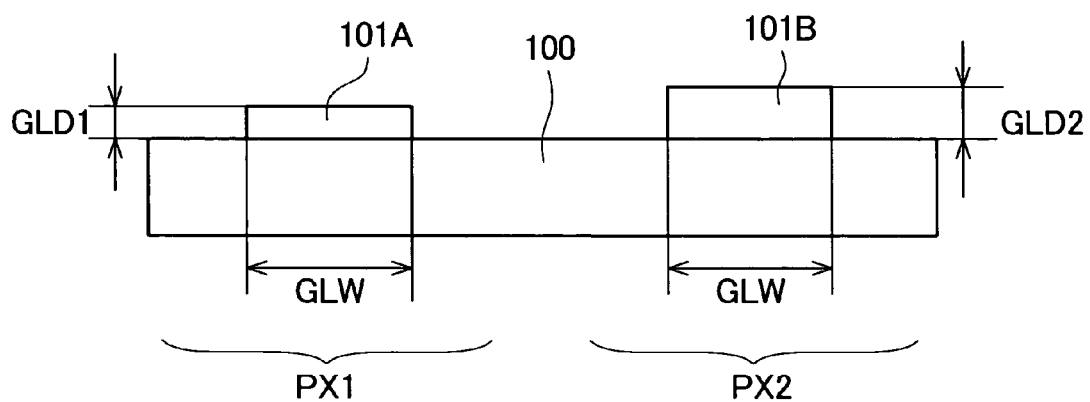
FIG. 11 is a schematic view for explaining one example of the manufacturing method of the TFT substrate of this embodiment and also is a view for explaining drawbacks when gate electrode lines are formed via conventional method.
Figure 12:
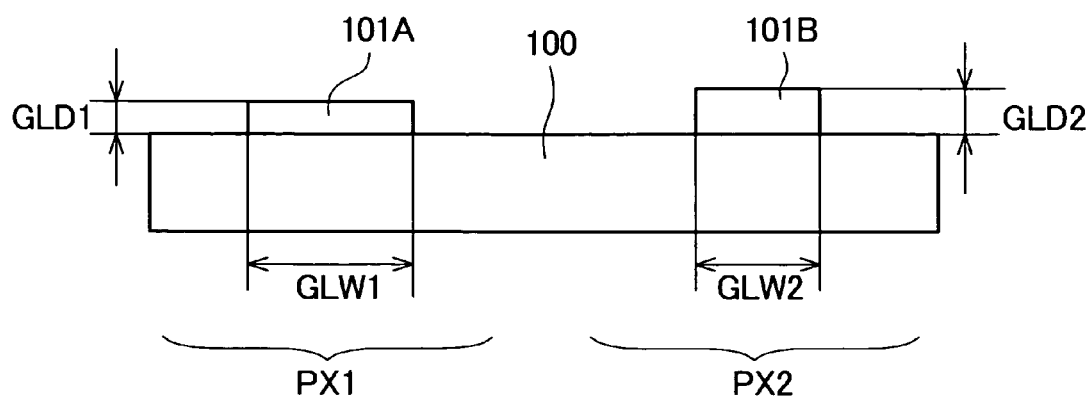
FIG. 12 is a schematic view for explaining one example of the manufacturing method of the TFT substrate of this embodiment and also is a view showing one example of a method for overcoming conventional drawbacks.
Figure 13:
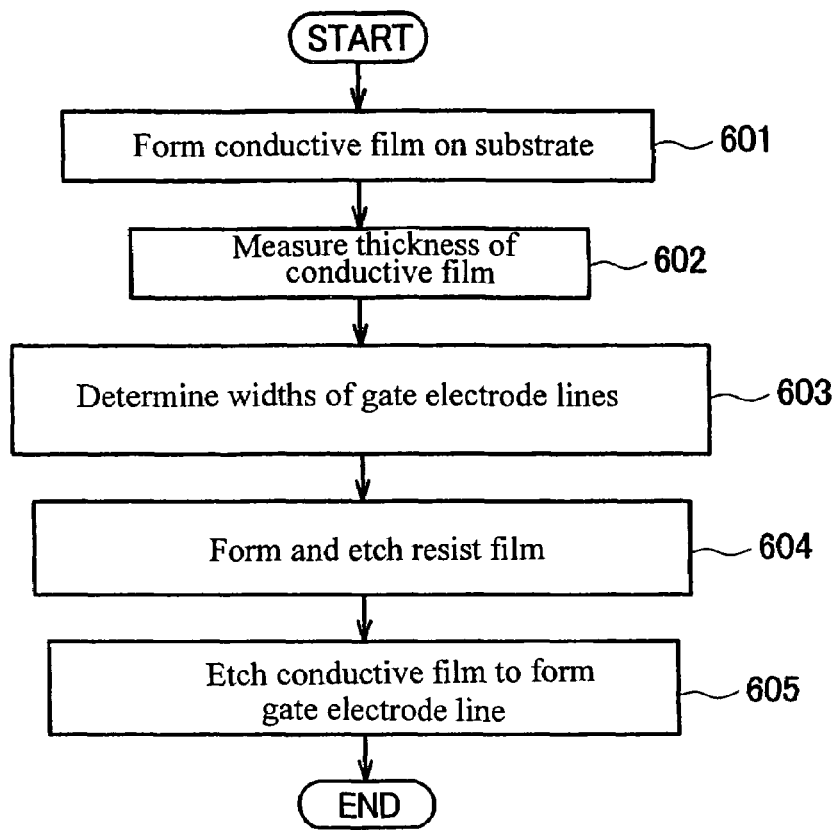
FIG. 13 is a schematic view for explaining one example of the manufacturing method of the TFT substrate of this embodiment and also is a flow chart showing steps for forming the gate electrode lines for overcoming the conventional drawbacks.

FIG. 9 to FIG. 13 is are schematic views for explaining one example of a manufacturing method of the TFT substrate of this embodiment, wherein FIG. 9 is a plan view of a step for forming a conductive film for forming gate electrode lines, FIG. 10 is a cross-sectional view taken along a line E-E' in FIG. 9, FIG. 11 is a view for explaining drawbacks when gate electrode lines are formed via conventional method, FIG. 12 is a view showing one example of a method for overcoming conventional drawbacks and FIG. 13 is a flow chart showing steps for forming the gate electrode lines for overcoming the conventional drawbacks.

The TFT substrate 1 of this embodiment is basically manufactured using steps substantially equal to the conventional manufacturing steps. Accordingly, the detailed explanation of the respective steps and materials for manufacturing the TFT substrate 1 is omitted, and only constitutional features of the manufacturing steps are explained.

In manufacturing the TFT substrate 1 of this embodiment, first of all, as shown in FIG. 9 and FIG. 10, a conductive film 101Z for forming gate electrodes is formed on the transparent substrate 100 made of a glass substrate or the like. Here, when the TFT substrate 1 is, for example, a substrate which is used in a liquid crystal display device such as a display of a personal computer or a television receiver set, for example, and an area of the transparent substrate 100 is large, there may be a case that the film thickness of the conductive film 101Z is gradually increased, for example, as shown in FIG. 10, from a film thickness $D_0$ at y=0 of the transparent substrate to a film thickness $D_Y$ at y=Y of the transparent substrate.

Here, for example, when etching resist is formed on the conductive film 101Z using a method which performs the exposure using a conventional mask thus forming gate electrode lines 101, as shown in FIG. 11, irrespective of a film thickness of the conductive film 101Z, gate electrode lines 101A, 101B having a preliminarily fixed width GLW are formed. Accordingly, a cross-sectional area GLD1×GLW of the gate electrode line 101A in a region PX1 where a film thickness of a conductive film is GLD1 and a cross-sectional area GLD2×GLW of the gate electrode line 101B in a region PX2 where a film thickness of a conductive film is GLD2 differ from each other and hence, the irregularities in line resistance are generated with respect to the respective gate electrode lines.

Then, in forming the etching resist, a method which directly draws a pattern on a resist film based on numerical data such as CAD layout data is used. When the method which directly draws the pattern is used, for example, after the formation of the conductive film 101Z on the transparent substrate 100, the film thickness distribution of the conductive film 101Z is measured, and the numerical data is corrected such that the width of the gate electrode line is increased in the region where the film thickness of the conductive film is small and the width of the gate electrode line is made small in the region where the thickness of the conductive film is large. Subsequently, the pattern is drawn based on the corrected numerical data thus forming the etching resist. Here, the numerical data is, for example, as shown in FIG. 12, corrected such that assuming the width of the gate electrode line 101A in the region PX1 as GLW1 and the width of the gate electrode line 101B in the region PX2 as GLW2, the relationship GLW1>GLW2 is established. Further, it is preferable to correct the numerical data such that, for example, the cross-sectional area GLD1×GLW1 of the gate electrode line 101A in the region PX1 and the cross-sectional area GLD2×GLW2 of the gate electrode line 101B in the region PX2 become equal to each other. Here, in FIG. 12, the example of correction which compares only two regions PX1, PX2 is exemplified, in an actual operation, the film thickness is measured on the whole region of the conductive film 101Z and the above-mentioned numerical data is corrected to a width corresponding to the film thicknesses of the respective regions.

Then, the etching resist is formed on the conductive film 101Z based on the above-mentioned corrected numerical data, and the gate electrode lines 101A, 101B are formed whereby the cross-sectional areas of all gate electrode lines on the transparent substrate 100 become substantially equal thus enabling the reduction of the irregularities of line resistances of the respective gate electrode lines.

To summarize such steps for forming the gate electrode lines, the steps can be expressed by a flow chart shown in FIG. 13. That is, first of all, as shown in FIG. 13, the conducive film 101Z for forming the gate electrode lines is formed on the glass substrate 100 (step 601). Next, the film thickness distribution of the formed conductive film 101Z is measured (step 602). Subsequently, the widths of the respective gate electrode lines 101 are determined based on the film thickness distribution of the conductive film 101Z and the numerical data for drawing is corrected (step 603). Next, the resist film is formed on the conductive film 101Z and the pattern is drawn based on the updated numerical data and the developing is performed to form the etching resist (step 604). Thereafter, the conductive film 101Z is etched to form the gate electrode lines 101 and the etching resist is removed (step 605). By adopting such steps, for example, it is possible to make the cross-sectional areas of all gate electrode lines on the transparent substrate 100 substantially equal to each other as shown in FIG. 12.

Further, after forming the gate electrode lines 101 using the steps shown in FIG. 13, the TFT elements and the display electrodes 107 are formed in accordance with steps similar to corresponding steps of the conventional manufacturing method of the TFT substrate 1.

As has been explained above, according to the TFT substrate 1 of this embodiment, the cross-sectional areas GLD×GLW of all gate electrode lines 101 on the transparent substrate 100 are substantially set to a fixed value and hence, the irregularities of line resistances of the respective gate electrode lines are small. Accordingly, the liquid crystal display device using the TFT substrate 1 of this embodiment can reduce the irregularities of the image quality on the screen.

Further, by forming the gate electrode lines 100 using the steps shown in FIG. 13, for example, different from the prior art, it is no more necessary to increase the film thickness of the conductive film or to increase the widths of the gate electrode lines to set the line resistances of the gate electrode lines 100 to a fixed value or below in the whole region of the TFT substrate 1 and hence, it is possible to prevent the lowering of the performance of the liquid crystal display device.

Further, in this embodiment, for example, as shown in FIG. 6 to FIG. 8, the example which reduces the irregularities of line resistances of the different gate electrode lines 101A, 101B on the transparent substrate 100 is illustrated. However, the present invention is not limited to such an example and even when the irregularities of the film thickness are present with respect to one gate electrode line, it is possible to reduce the irregularities of the line resistance by adopting the steps of this embodiment.

Figure 14:
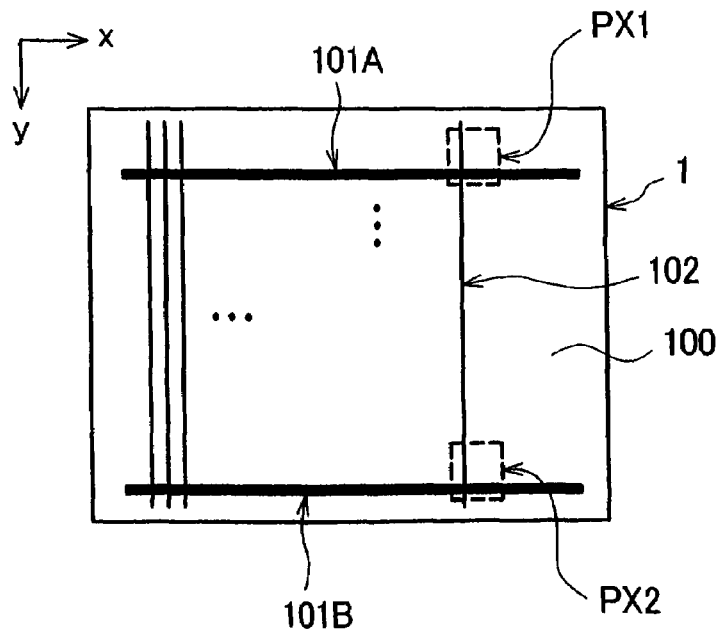
FIG. 14 is a schematic view showing the relationship of two regions where the irregularities of a film thickness of the conductive film of the gate electrode lines are generated, wherein the data electrode lines are used in common and the gate electrode lines differ from each other.
Figure 15:
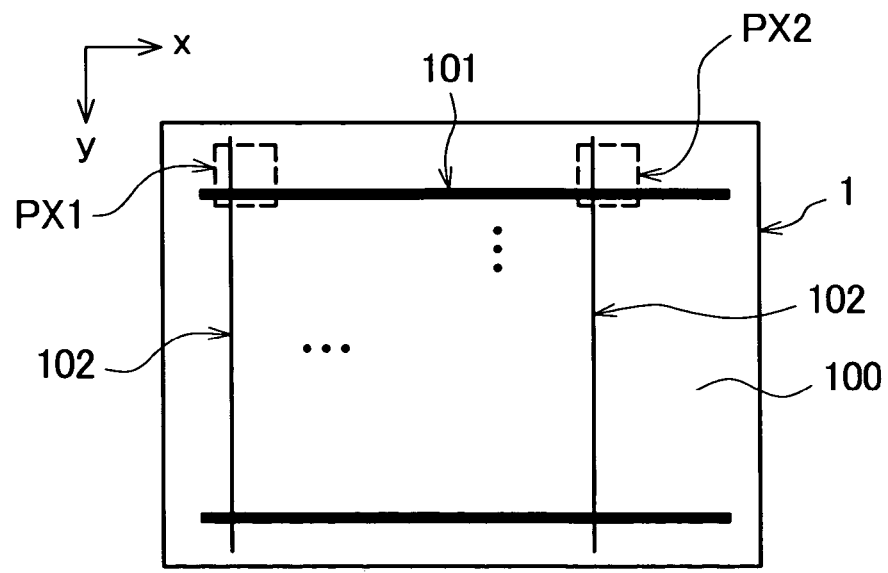
FIG. 15 is a schematic view showing the relationship of two regions where the irregularities of a film thickness of the conductive film of the gate electrode lines are generated, wherein gate electrode lines are used in common and the data electrode lines differ from each other.
Figure 16:
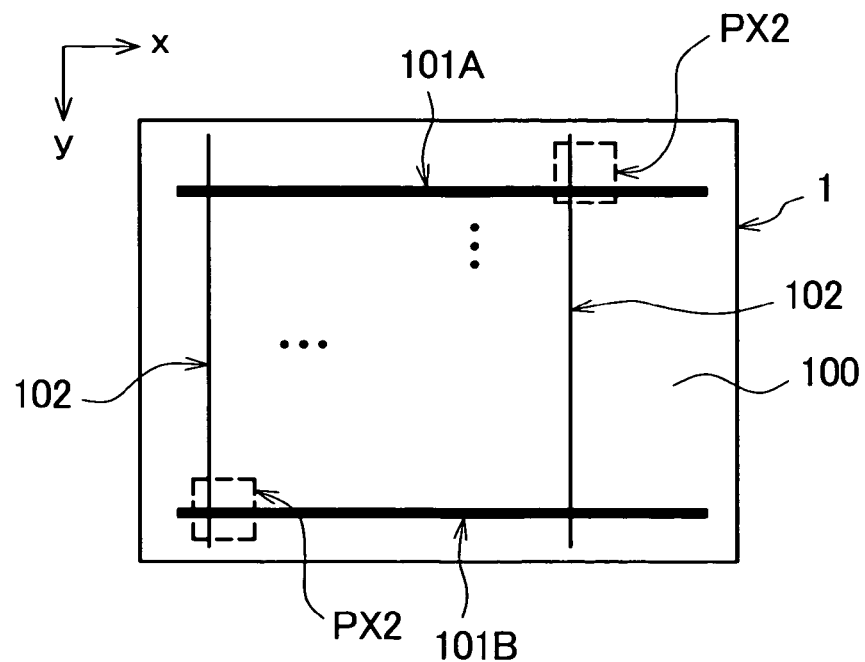
FIG. 16 is a schematic view showing the relationship of two regions where the irregularities of a film thickness of the conductive film of the gate electrode lines are generated, wherein both of the gate electrode lines and the data electrode lines differ from each other.
Figure 17:
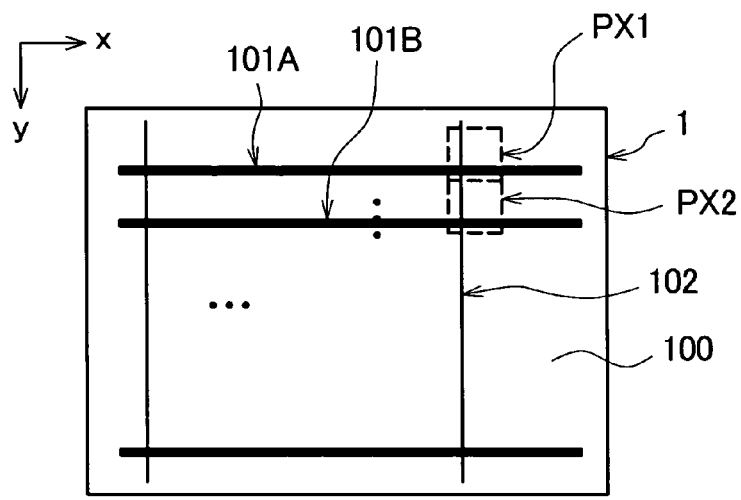
FIG. 17 is a schematic view showing another example of the relationship of two regions where the irregularities of a film thickness of the conductive film of the gate electrode lines are generated, wherein the data electrode lines are used in common and the gate electrode lines differ from each other.

FIG. 14 to FIG. 17 are schematic views showing the relationship of two regions where the irregularities of a film thickness of the conductive film of the gate electrode lines are generated wherein FIG. 14 shows a case in which the data electrode lines are used in common and the gate electrode lines differ from each other, FIG. 15 shows a case in which gate electrode lines are used in common and the data electrode lines differ from each other, FIG. 16 shows a case in which both of the gate electrode lines and the data electrode lines differ from each other, and FIG. 17 shows a case in which the data electrode lines are used in common and the gate electrode lines differ from each other.

In comparing the film thicknesses of the conductive films of the gate electrode lines in two arbitrary regions PX1, PX2 on the transparent substrate 100, as the positional relationship between the respective regions PX1, PX2 which may generate the difference in the film thickness, for example, first off all, as shown in FIG. 14, the positional relationship in which the data electrode line 102 is used in common and the gate electrode lines 101A, 101B are largely separated from each other is named. Here, for example, when the film thickness distribution of the conductive film 101Z formed on the transparent substrate 100 is irregular in the y direction, the film thicknesses of the regions PX1 and PX2 differ from each other.

Further, as another example, for example, as shown in FIG. 15, there may be a case that even when two regions PX1, PX2 assume the positional relationship in which the gate electrode line 101 is used in common and the data electrode lines 102 are different form each other, the irregularities of the film thickness arises. Also in such a case, by forming the gate electrode lines 101 while correcting the numerical data such that the width of the gate electrode line is changed in response to the change of the film thickness in the x direction of one gate electrode line using the steps exemplified in FIG. 13, it is possible to reduce the irregularities of the line resistance within one gate electrode line.

Further, as shown in FIG. 16, even when two regions PX1, PX2 assume the positional relationship in which the gate electrode lines 101A, 101B and the data electrode lines 102 are different form each other, the irregularities of the film thickness arises. Also in such a case, by forming the gate electrode lines 101A, 101B while correcting the numerical data to widths in response to the film thicknesses of the conductive films of the respective regions PX1, PX2 using the steps shown in FIG. 13, it is possible to reduce the irregularities of the line resistances of the gate electrode lines 101A, 101B of the respective regions PX1, PX2.

Still further, the example shown in FIG. 14 assumes the positional relationship in which the data electrode line 102 is used in common, the gate electrode lines 101A, 101B are different form each other, and, at the same time, two gate electrode lines 101A and 101B are largely separated from each other. However, the positional relationship of the electrode lines is not limited to such a positional relationship and, for example, as shown in FIG. 17, there may be a case in which even when two regions PX1, PX2 are arranged close to each other, the irregularities of the film thickness arises. Also in such a case, by forming the gate electrode lines 101A, 101B while correcting the numerical data to the widths in response to the film thicknesses of the conductive films of the respective regions PX1, PX2 using the steps shown in FIG. 13, it is possible to reduce the line resistances of the gate electrode lines 101A, 101B of the respective regions PX1, PX2.

In the above-mentioned embodiment, the relationship between the film thickness and the width of the conductive film of the gate electrode line at two arbitrary portions (two pixels) in the display region of the liquid crystal display device has been explained.

Hereinafter, on the premise of the above-mentioned embodiment, the relationship between the film thickness and the width of the conductive film of the gate electrode line at specified three portions of the liquid crystal display device is explained.

Currently, a substrate such as the TFT substrate 1 or the counter substrate 2 which is used as the display panel of the liquid crystal display device is, for example, manufactured by cutting out two sheets of substrates or four sheets of display panels from one sheet of mother glass.

Figure 18:
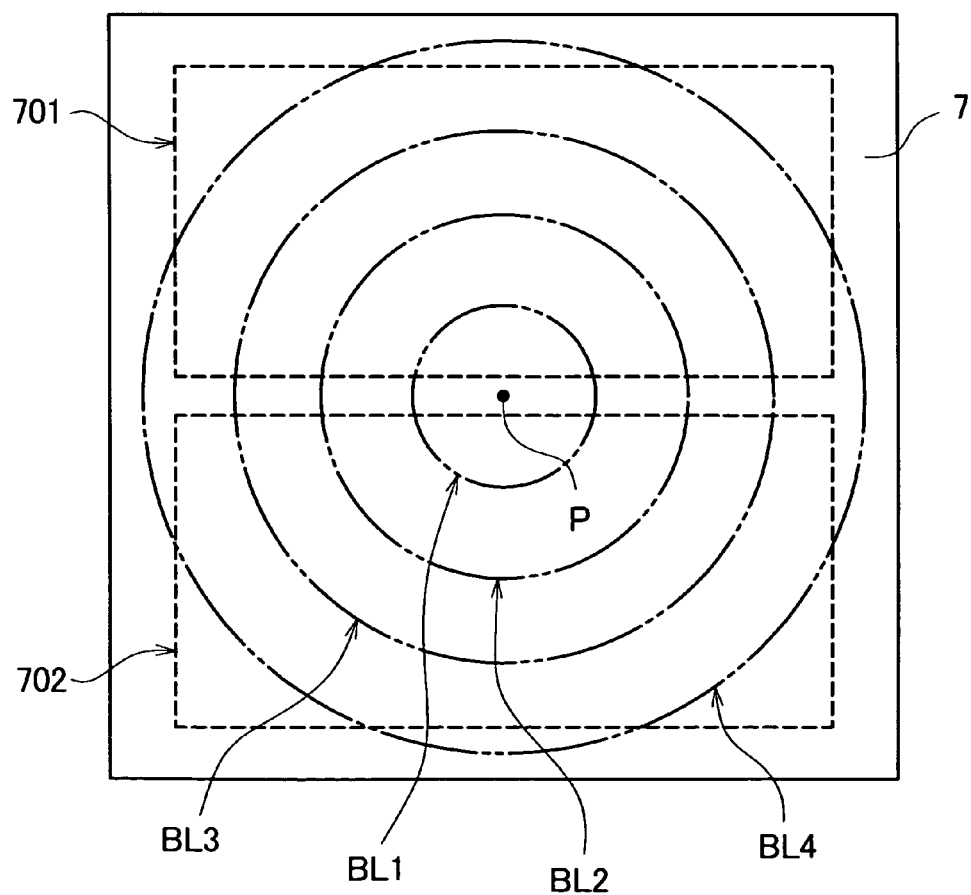
FIG. 18 is a schematic view showing the film thickness distribution of the conductive film when two substrates are cut out from one mother glass.

FIG. 18 is a schematic view showing the film thickness distribution of a metal film which constitutes gate electrode lines, for example, when two sheets of substrates are cut out from one sheet of mother glass. In the actual manufacture, the metal film is formed into an electrode having a desired shape using a resist film.

In case of cutting out two sheets of substrates from one sheet of mother glass, that is, in case of so-called two-piece manufacturing, as shown in FIG. 18, there exist regions 701, 702 which are cut out as two sheets of substrates in the mother glass 7. On these two regions 701, 702, for example, the TFT substrate 1 having the constitution shown in FIG. 2 to FIG. 5 is formed respectively. Further, after the formation of the TFT substrate 1 on each region 701, 702, two sheets of regions 701, 702 are cut out from the mother glass 7 to form display panels.

In such two-piece manufacturing, in forming a plurality of first lines (for example gate electrode lines 101) on the respective regions 701, 702 of the mother glass 7, first of all, the metal film is formed. Here, the distribution of the film thickness can be, for example, as shown in FIG. 18, expressed as concentric circles BL1, BL2, BL3, BL4 which are formed about the center P on the mother glass 7. Here, the film thickness of the metal film is gradually decreased in order from a region inside the concentric circle BL1 including the center P, a region outside the concentric circle BL1 and inside the concentric circle BL2, a region outside the concentric circle BL2 and inside the concentric circle BL3, and a region outside the concentric circle BL3 and inside the concentric circle BL4. Further, even in the inside of each region, the film thickness of the metal film is gradually decreased as the distance from the center P is increased. The film thickness of the metal film is gradually decreased also in a region outside the concentric circle BL4 as the distance from the center P is increased. This constitution is adopted, in forming metal, for realizing the formation of metal using a target spattering method, for example. In addition, when we form insulating film on the substrate using a plasma CDV method, the film thickness of the insulating film is gradually decreased also in a region outside the concentric circle BL4 as the distance from the center P is increased.

Figure 19:
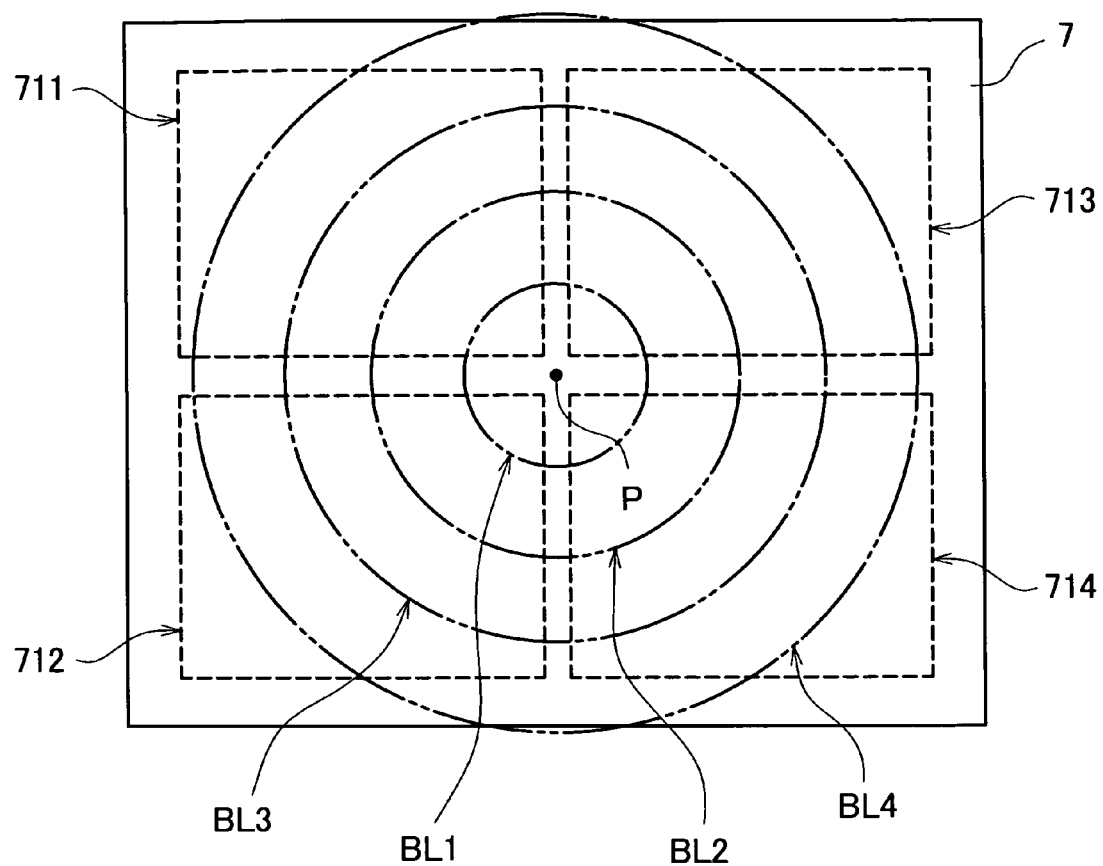
FIG. 19 is a schematic view showing the film thickness distribution of the conductive film when four substrates are cut out from one mother glass.

FIG. 19 is a schematic view showing the film thickness distribution of a metal film when four sheets of substrates are cut out from one sheet of mother glass.

In case of cutting out four sheets of substrates from one sheet of mother glass, that is, in case of so-called four-piece manufacturing, as shown in FIG. 19, there exist regions 711, 712, 713, 714 which are cut out as four sheets of substrates in the mother glass 7. On these four regions 711 to 714, for example, the TFT substrate 1 having the constitution shown in FIG. 2 to FIG. 5 is formed respectively. Further, after the formation of the TFT substrate 1 on each region, four sheets of regions 711 to 714 are cut out from the mother glass 7 to form display panels.

In such four-piece manufacturing, when the metal film is formed on the four regions 711 to 714 of the mother glass 7, the distribution of the film thickness can be, for example, as shown in FIG. 19, expressed as concentric circles BL1, BL2, BL3, BL4 which are formed about the center P on the mother glass 7. Here, the film thickness of the metal film is gradually decreased in order from a region inside the concentric circle BL1 including the center P, a region outside the concentric circle BL1 and inside the concentric circle BL2, a region outside the concentric circle BL2 and inside the concentric circle BL3, and a region outside the concentric circle BL3 and inside the concentric circle BL4. Further, even in the inside of each region, the film thickness of the metal film is gradually decreased as the distance from the center P is increased. The film thickness of the metal film is gradually decreased also in a region outside the concentric circle BL4 as the distance from the center P is increased.

Figure 20:
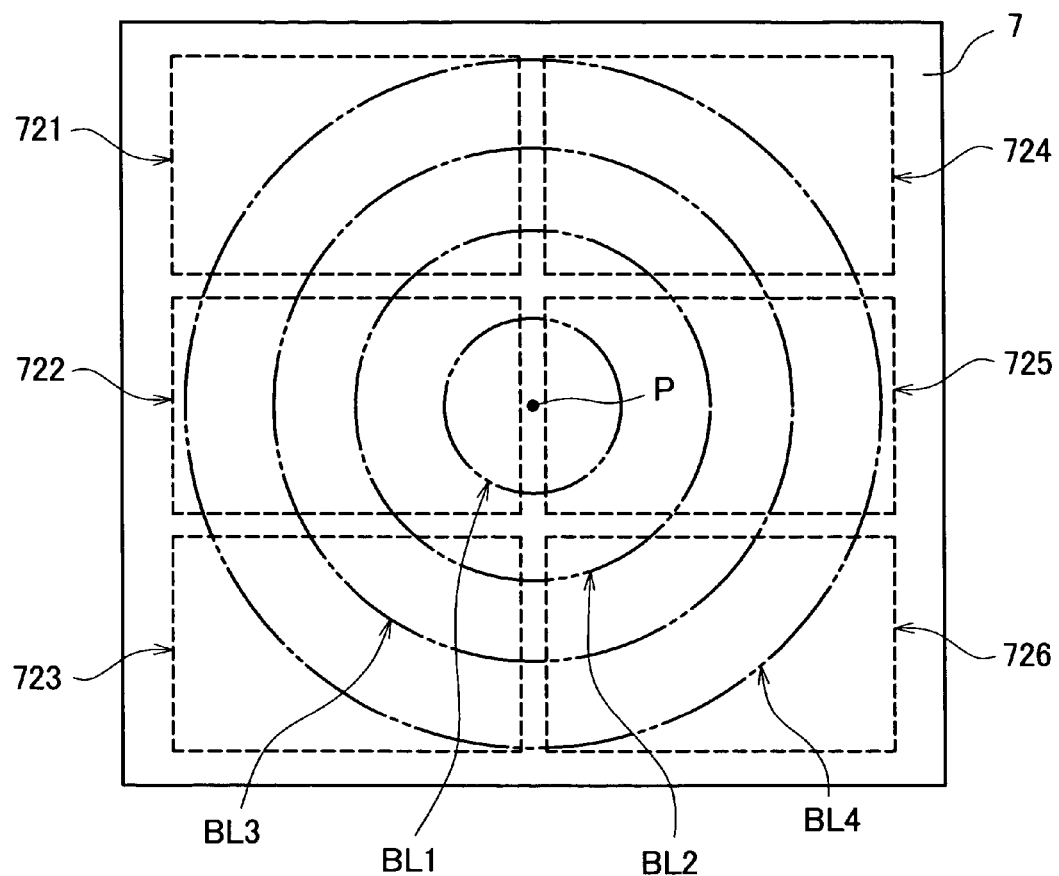
FIG. 20 is a schematic view showing the film thickness distribution of the conductive film when six substrates are cut out from one mother glass.

FIG. 20 is a schematic view showing the film thickness distribution of a metal film when six sheets of substrates are cut out from one sheet of mother glass.

In case of cutting out six sheets of substrates from one sheet of mother glass, that is, in case of so-called six-piece manufacturing, as shown in FIG. 20, there exist regions 721, 722, 723, 724, 725, 726 which are cut out as six sheets of substrates in the mother glass 7. On these six regions 721 to 726, for example, the TFT substrate 1 having the constitution shown in FIG. 2 to FIG. 5 is formed respectively. Further, after the formation of the TFT substrate 1 on each region, six sheets of regions 721 to 726 are cut out from the mother glass 7 to form display panels.

In such six-piece manufacturing, when the metal film is formed on the six regions 721 to 726 of the mother glass 7, the distribution of the film thickness can be, for example, as shown in FIG. 20, expressed as concentric circles BL1, BL2, BL3, BL4 which are formed about the center P on the mother glass 7. Here, the film thickness of the metal film is gradually decreased in order from a region inside the concentric circle BL1 including the center P, a region outside the concentric circle BL1 and inside the concentric circle BL2, a region outside the concentric circle BL2 and inside the concentric circle BL3, and a region outside the concentric circle BL3 and inside the concentric circle BL4. Further, even in the inside of each region, the film thickness of the metal film is gradually decreased as the distance from the center P is increased. The film thickness of the metal film is gradually decreased also in a region outside the concentric circle BL4 as the distance from the center P is increased.

Figure 21:
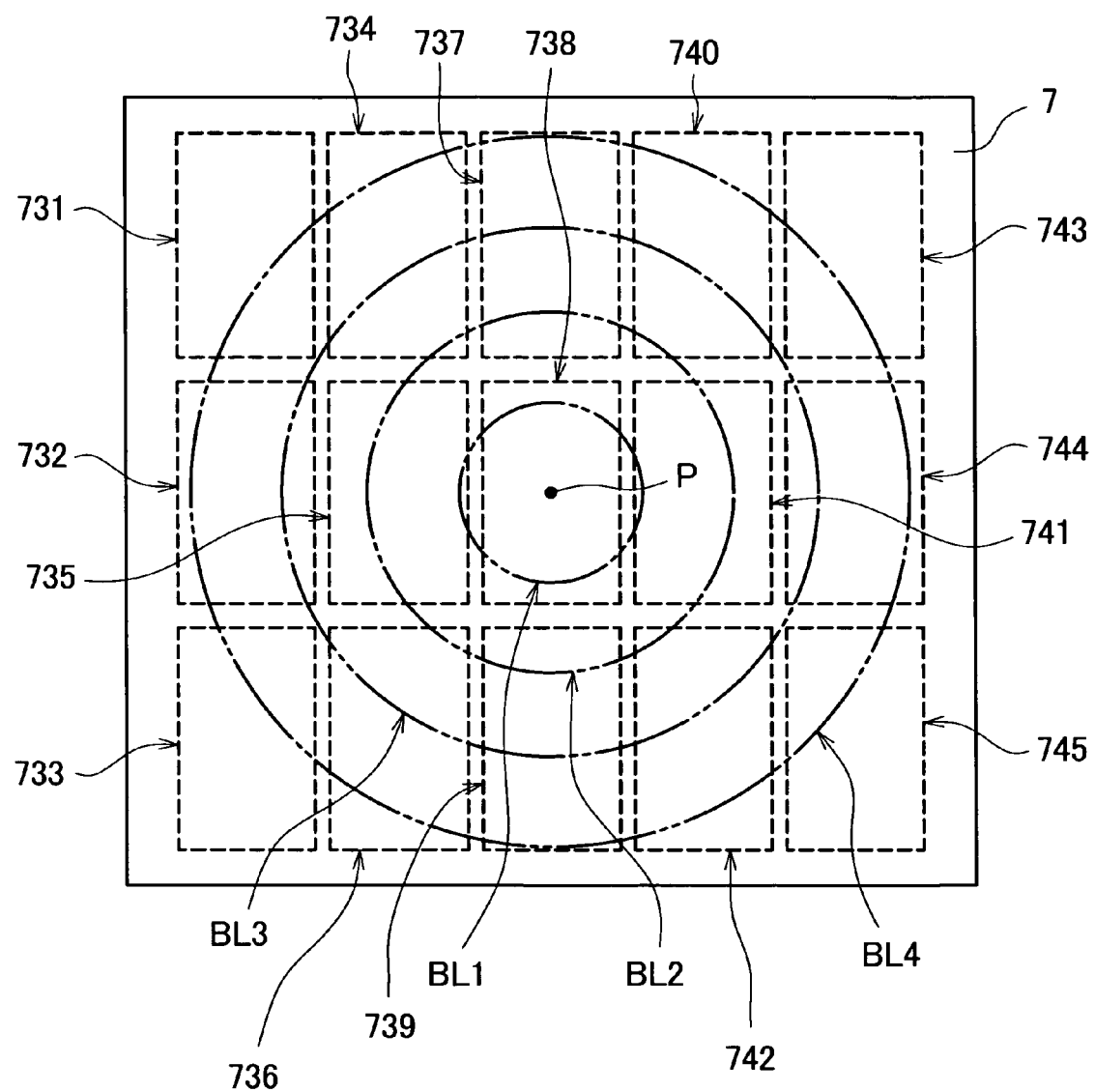
FIG. 21 is a schematic view showing the film thickness distribution of the conductive film when fifteen substrates are cut out from one mother glass.

FIG. 21 is a schematic view showing the film thickness distribution of a metal film when fifteen sheets of substrates are cut out from one sheet of mother glass.

In case of cutting out fifteen sheets of substrates from one sheet of mother glass, that is, in case of so-called fifteen-piece manufacturing, as shown in FIG. 21, there exist regions 731, 732, 733, 734, 735, 736, 737, 738, 739, 740, 741, 742, 743, 744, 745 which are cut out as fifteen sheets of substrates in the mother glass 7. On these fifteen regions 731 to 745, for example, the TFT substrate 1 having the constitution shown in FIG. 2 to FIG. 5 is formed respectively. Further, after the formation of the TFT substrate 1 on each region, fifteen sheets of regions 731 to 745 are cut out from the mother glass 7 to form display panels.

In such fifteen-piece manufacturing, when the metal film is formed on the fifteen regions 731 to 745 of the mother glass 7, the distribution of the film thickness can be, for example, as shown in FIG. 21, expressed as concentric circles BL1, BL2, BL3, BL4 which are formed about the center P on the mother glass 7. Here, the film thickness of the metal film is gradually decreased in order from a region inside the concentric circle BL1 including the center P, a region outside the concentric circle BL1 and inside the concentric circle BL2, a region outside the concentric circle BL2 and inside the concentric circle BL3, and a region outside the concentric circle BL3 and inside the concentric circle BL4. Further, even in the inside of each region, the film thickness of the metal film is gradually decreased as the distance from the center P is increased. The film thickness of the metal film is gradually decreased also in a region outside the concentric circle BL4 as the distance from the center P is increased.

Here, as shown in FIG. 18 to FIG. 21, it is understood that the distribution of film thicknesses of respective regions which are cut out when the multi-piece manufacturing is performed from one sheet of mother glass 7, that is, the distribution of the film thickness of metal in one sheet of substrate is classified in following four patterns.

The first pattern is a pattern in which the distribution of the film thickness of the insulating film defines the region 701 shown in FIG. 18 or the regions 737, 739 shown in FIG. 21. The feature of this fist pattern is explained in conjunction with FIG. 22.

Figure 22:
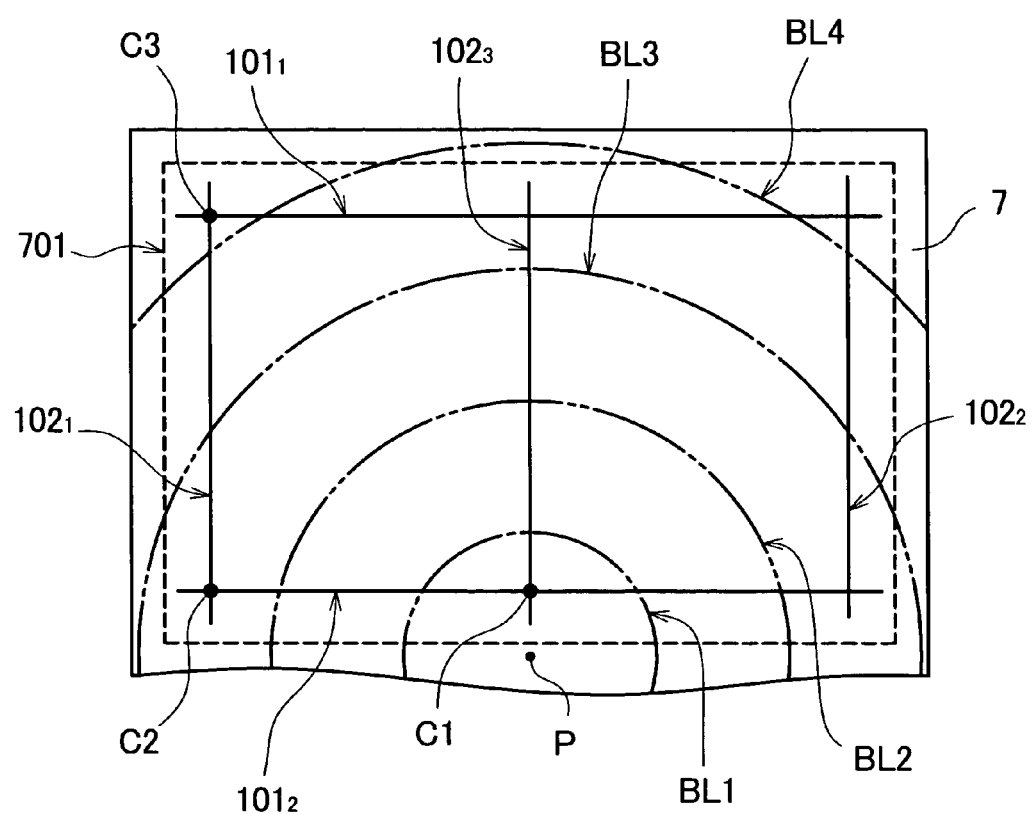
FIG. 22 is a view for explaining a first pattern of the film thickness distribution of the conductive film on one substrate.

FIG. 22 is a schematic view for explaining the first pattern of the film thickness distribution of the metal film in one sheet of substrate.

In explaining the first pattern of the film thickness distribution of the metal film, as shown in FIG. 22, one region 701 of the mother glass 7 in the two-piece manufacturing is taken as an example. In FIG. 22, numerals $101_1$, $101_2$ indicate the gate electrode lines which are arranged at an outermost portion in the display region, and numerals $102_1$, $102_2$ indicate the data electrode lines which are arranged at the outermost portion in the display region. That is, a region which is surrounded by these two gate signal lines $101_1$, $101_2$ and two data electrode lines $102_1$, $102_2$ constitutes the display region which is referred in the present invention (the rectangular display region in the present invention). Further, in this display region, a plurality of gate electrode lines not shown in the drawing, the data electrode line $102_3$ which are arranged at a center portion of the display region and a plurality of data electrode lines not shown in the drawing are arranged.

In the first pattern, a film thickness t1 of the conductive film of the gate electrode line at a center portion of the outermost gate electrode line $101_2$ in the display region within the region 701 shown in FIG. 22, that is, at a point C1 where the gate electrode line $101_2$ intersects the data signal line $102_3$ assumes the largest thickness. Further, a film thickness t2 of the conductive film of the gate electrode line at a point C2 where the gate electrode line $101_2$ intersects the outermost data signal line $102_1$ on the extension of the point C1 in the display region becomes smaller than the film thickness t1 of the conductive film of the gate electrode line at the point C1. Further, a film thickness t3 of the conductive film of the gate electrode line at a point C3 where the data electrode line $102_1$ in the display region intersects another outermost gate electrode line $101_1$ in the display region becomes smaller than the film thickness t2 of the conductive film of the gate electrode line at the point C2.

Further, with respect to the relationship between the film thickness and the width of the conductive film of the gate electrode line in the display device of the present invention in which the plurality of gate electrode lines are arranged on the substrate, the insulating film is arranged above the gate electrode lines, and the plurality of data electrode lines are arranged on the insulating film in a state that the data electrode lines intersect the plurality of gate electrode lines, assuming the film thickness and the width of the conductive film at the center of the outermost gate electrode line in the display region of the substrate (region 701) as t1 and w1, the film thickness and the width of the conductive film of the gate electrode line at the portion where the outermost gate electrode line intersects the outermost data electrode line in the display region as t2 and w2, and the film thickness and the width of the conductive film of the gate electrode line at the portion where the data electrode line intersects the outermost gate electrode line on a side opposite to the display region as t3 and w3, the relationship t1>t2>t3 is established and, at the same time, the relationship w1<w2<w3 is established. This is the feature of the relationship between the film thickness and the width of the metal film, that is, the conductive film of the gate electrode line in the first pattern.

In this case, it is desirable that the gate electrode lines and data electrode lines are configured such that the products at respective portions, that is t1×w1, t2×w2 and t3×w3 become equal to each other.

To recapitulate the feature of the display device of the first pattern, there is provided the display device in which a plurality of first electrode lines such as gate electrode lines, for example, and a plurality of second electrode lines such as data electrode lines, for example, which are arranged above the plurality of first electrode lines in a state that the second electrode lines intersect the first electrode lines by way of an insulating film such as a gate insulating film, for example, and rectangular display regions are formed by the plurality of first electrode lines and the plurality of second electrode lines, wherein at three arbitrary portions on the display region where the first electrode line and the second electrode line intersect each other, assuming a film thickness and a width of a conductive film of the first electrode line in the first portion as t1 and w1, a film thickness and a width of a conductive film of the first electrode line in the second portion as t2 and w2, and a film thickness and a width of a conductive film of the first electrode line in the third portion as t3 and w3, when the film thickness relationship of t1>t2>t3 is established, the width relationship of w1<w2<w3 is established, wherein the first portion is the center portion of the first electrode line which is arranged on the uppermost side of the display region, the second portion is the portion where the uppermost first electrode line intersects the second electrode line which is arranged on the outermost side of the display region, and the third portion is the portion where the second electrode line at the second portion intersects the first electrode line arranged on the lowermost side of the display region.

Further, there may be a case that the first portion is the center portion of the first electrode line arranged on the lowermost side of the display region, the second portion is the portion where the first lowermost electrode line intersects the second electrode line arranged on the outermost side of the display region, and the third portion is the portion where the second electrode line of the second portion intersects the fist electrode line positioned on the uppermost side of the display region.

Here, although FIG. 22 shows the case of two-piece manufacturing as the example of the first pattern, it is needless to say that the regions 737, 739 in the fifteen-piece manufacturing shown in FIG. 21 also possess the similar relationship (feature).

The display device having such a relationship can reduce the image quality irregularities.

Next, the second pattern is explained. The second pattern is a pattern in which the distribution of the film thickness of the conductive film defines the region 722, 725 shown in FIG. 20 or the regions 732, 735, 741, 744 shown in FIG. 21. The feature of this second pattern is explained in conjunction with FIG. 23.

Figure 23:
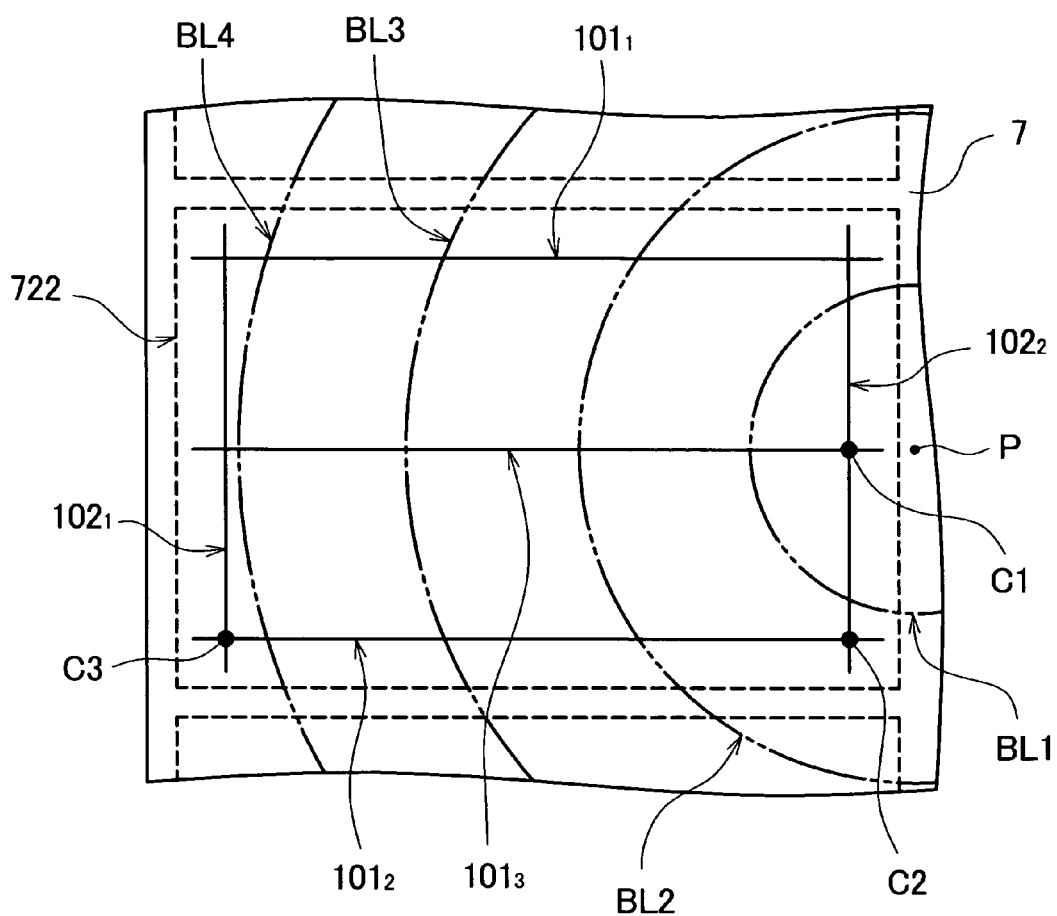
FIG. 23 is a view for explaining a second pattern of the film thickness distribution of the conductive film on one substrate.

FIG. 23 is a schematic view for explaining the second pattern of the film thickness distribution of the conductive film in one sheet of substrate.

In explaining the second pattern of the film thickness distribution of the conductive film, as shown in FIG. 23, one region 722 of the mother glass 7 in the six-piece manufacturing is taken as an example. In FIG. 23, numerals $101_1$, $101_2$ indicate the gate electrode lines which are arranged at an outermost portion in the display region, and numerals $102_1$, $102_2$ indicate the data electrode lines which are arranged at the outermost portion in the display region. That is, a region which is surrounded by these two gate electrode lines $101_1$, $101_2$ and two data electrode lines $102_1$, $102_2$ constitutes the display region which is referred in the present invention. Further, in this display region, the gate electrode line $101_3$ which is arranged at a center portion of the display region, a plurality of gate electrode lines not shown in the drawing and a plurality of data electrode lines not shown in the drawing are arranged.

In the second pattern, a film thickness t1 of the conductive film of the gate electrode line at a center portion of the outermost data electrode line $102_2$ in the display region within the region 722 shown in FIG. 23, that is, at a point C1 where the data signal line intersects the gate electrode line $101_3$ assumes the largest thickness. Further, a film thickness t2 of the conductive film of the gate electrode line at a point C2 where the outermost gate electrode line $101_1$ intersects the data electrode line $102_2$ on the extension of the point C1 in the display region becomes smaller than the film thickness t1 of the conductive film of the gate electrode line at the point C1. Further, a film thickness t3 of the conductive film of the gate electrode line at a point C3 where the gate electrode line $101_1$ in the display region intersects another outermost data electrode line $102_1$ in the display region becomes smaller than the film thickness t2 of the conductive film of the gate electrode line at the point C2.

Further, with respect to the relationship between the film thickness and the width of the conductive film of the gate electrode line in the display device of the present invention in which the plurality of gate electrode lines are arranged on the substrate, the insulating film is arranged above the gate electrode lines, and the plurality of data electrode lines are arranged on the insulating film in a state that the data electrode lines intersect the plurality of gate electrode lines, assuming the film thickness and the width of the conductive film of the gate electrode line at the center of the outermost data electrode line in the display region of the substrate (region 722) as t1 and w1, the film thickness and the width of the conductive film of the gate electrode line at the portion where the outermost data electrode line intersects the outermost gate electrode line in the display region as t2 and w2, and the film thickness and the width of the conductive film of the gate electrode line at the portion where the gate electrode line intersects the outermost data electrode line on a side opposite to the display region as t3 and w3, the relationship t1>t2>t3 is established and, at the same time, the relationship w1<w2<w3 is established. This is the feature of the relationship between the film thickness and the width of the conductive film of the gate electrode line in the second pattern.

In this case, it is desirable that the gate electrode lines and data electrode lines are configured such that the products at respective portions, that is t1×w1, t2×w2 and t3×w3 become equal to each other.

To recapitulate the feature of the display device of the second pattern, there is provided the display device in which a plurality of first electrode lines such as gate electrode lines, for example, and a plurality of second electrode lines such as data electrode lines, for example, which are arranged above the plurality of first electrode lines in a state that the second electrode lines intersect the first electrode lines by way of an insulating film such as a gate insulating film, for example, are arranged on the substrate and rectangular display regions are formed by the plurality of first electrode lines and the plurality of second electrode lines, wherein at three arbitrary portions on the display region where the first electrode line and the second electrode line intersect each other, assuming a film thickness and a width of a conductive film of the first electrode line in the first portion as t1 and w1, a film thickness and a width of a conductive film of the first electrode line in the second portion as t2 and w2, and a film thickness and a width of a conductive film of the first electrode line in the third portion as t3 and w3, when the film thickness relationship of t1>t2>t3 is established, the width relationship of w1<w2<w3 is established, wherein the first portion is the center portion of the second electrode line which is arranged on the leftmost side of the display region, the second portion is the portion where the leftmost second electrode line intersects the first electrode line which is arranged on the uppermost side or the lowermost side of the display region, and the third portion is the portion where the first electrode line at the second portion intersects the second electrode line arranged on the rightmost side of the display region.

Further, there may be a case that the first portion is the center portion of the second electrode line arranged on the rightmost side of the display region, the second portion is the portion where the second rightmost electrode line intersects the first electrode line arranged on the uppermost side or the lowermost side of the display region, and the third portion is the portion where the first electrode line of the second portion intersects the second electrode line positioned on the leftmost side of the display region.

Here, although FIG. 23 shows the case of six-piece manufacturing as the example of the second pattern, it is needless to say that the regions 732, 735, 741, 744 in the fifteen-piece manufacturing shown in FIG. 21 also possess the similar relationship (feature).

The display device having such a relationship can reduce the image quality irregularities.

Next, the third pattern is explained. The third pattern is a pattern in which the distribution of the film thickness of the conductive film defines the regions 711, 712, 713, 714 shown in FIG. 19, or the regions 721, 723, 724, 726 shown in FIG. 20 or the regions 731, 733, 734, 736, 740, 742, 743, 745 shown in FIG. 21. The feature of this third pattern is explained in conjunction with FIG. 24.

Figure 24:
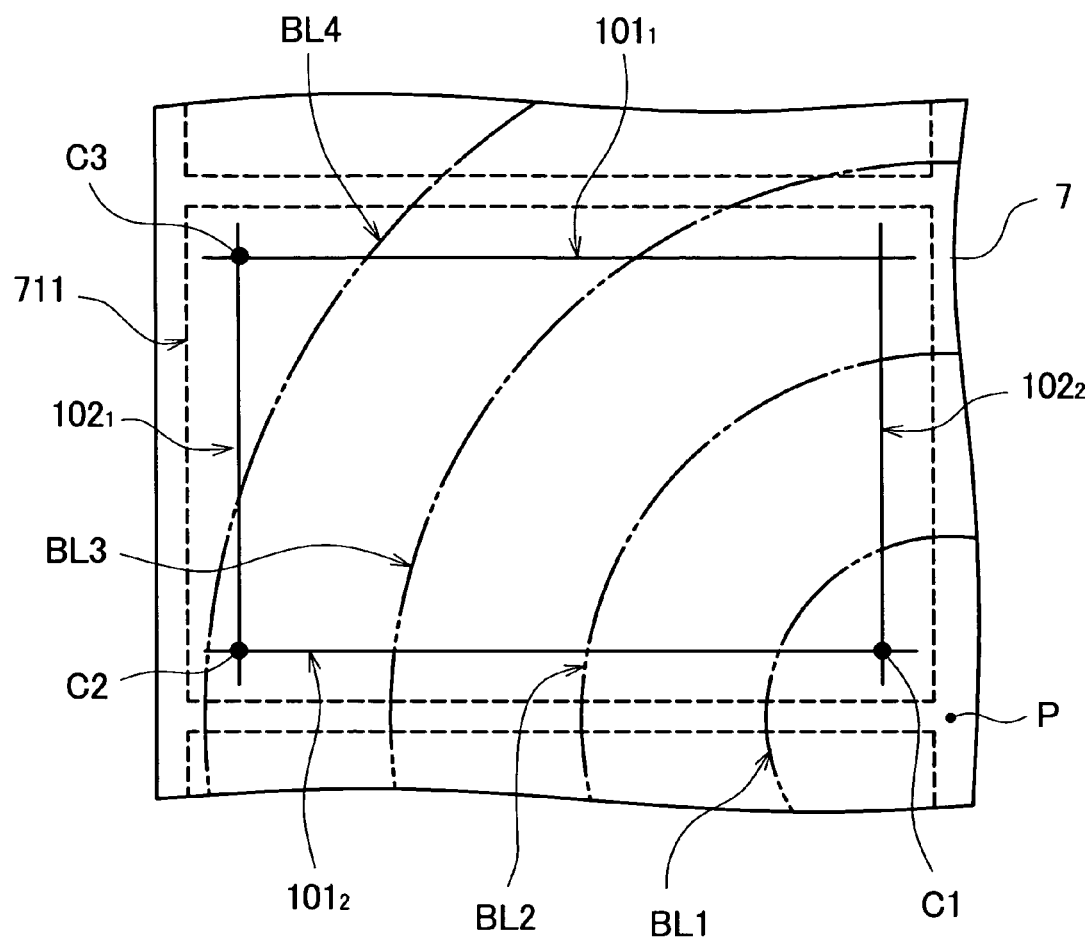
FIG. 24 is a view for explaining a third pattern of the film thickness distribution of the conductive film on one substrate.

FIG. 24 is a schematic view for explaining the third pattern of the film thickness distribution of the conductive film in one sheet of substrate.

In explaining the third pattern of the film thickness distribution of the conductive film, as shown in FIG. 24, one region 711 of the mother glass 7 in the four-piece manufacturing is taken as an example. In FIG. 24, numerals $101_1$, $101_2$ indicate the gate electrode lines which are arranged at an outermost portion in the display region, and numerals $102_1$, $102_2$ indicate the data electrode lines which are arranged at an outermost portion in the display region. That is, a region which is surrounded by these two gate electrode lines $101_1$, $101_2$ and two data electrode lines $102_1$, $102_2$ constitutes the display region which is referred in the present invention. Further, in this display region, a plurality of gate electrode lines not shown in the drawing, a plurality of data electrode lines not shown in the drawing are arranged.

In the third pattern, a film thickness t1 of the conductive film of the gate electrode line at a point C1 (corner portion) where the outermost gate electrode line $101_2$ and the data signal line $102_2$ intersect within the display region of the region 711 shown in FIG. 24 assumes the largest thickness. Further, a film thickness t2 of the conductive film of the gate electrode line at a point C2 where the gate electrode line $101_2$ intersects another outermost data electrode line $102_1$ on the extension of the point C1 in the display region becomes smaller than the film thickness t1 of the conductive film of the gate electrode line at the point C1. Further, a film thickness t3 of the conductive film of the gate electrode line at a point C3 positioned diagonal to the point C1 in the display region becomes smaller than the film thickness t2 of the conductive film of the gate electrode line at the point C2.

Further, with respect to the relationship between the film thickness and the width of the conductive film of the gate electrode line in the display device of the present invention in which the plurality of gate electrode lines are arranged on the substrate, the insulating film is arranged above the gate electrode lines, and the plurality of data electrode lines are arranged on the insulating film in a state that the data electrode lines intersect the plurality of gate electrode lines, assuming the film thickness and the width of the conductive film of the gate electrode line at a portion where the outermost gate electrode line of the display region of the substrate (region 711) and the data electrode line intersect (that is, a certain corner portion) as t1 and w1, the film thickness and the width of the conductive film of the gate electrode line at the portion where the gate electrode line extended from the above-mentioned corner portion intersects the data electrode line as t2 and w2, and the film thickness and the width of the conductive film of the gate electrode line at the portion which is arranged diagonal to the portion where the thickness of the conductive film of the gate electrode line in the display region is t1 as t3 and w3, the relationship t1>t2>t3 is established and, at the same time, the relationship w1<w2<w3 is established. This is the feature of the relationship between the film thickness and the width of the conductive film of the gate electrode line in the third pattern.

In this case, it is desirable that the gate electrode lines and data electrode lines are configured such that the products at respective portions, that is t1×w1, t2×w2 and t3×w3 become equal to each other.

To recapitulate the feature of the display device of the third pattern, there is provided the display device in which a plurality of first electrode lines such as gate electrode lines, for example, and a plurality of second electrode lines such as data electrode lines, for example, which are arranged above the plurality of first electrode lines in a state that the second electrode lines intersect the first electrode lines by way of an insulating film such as a gate insulating film, for example, are arranged on the substrate and rectangular display regions are formed by the plurality of first electrode lines and the plurality of second electrode lines, wherein at three arbitrary portions on the display region where the first electrode line and the second electrode line intersect each other, assuming a film thickness and a width of a conductive film of the first electrode line in the first portion as t1 and w1, a film thickness and a width of a conductive film of the first electrode line in the second portion as t2 and w2, and a film thickness and a width of a conductive film of the first electrode line in the third portion as t3 and w3, when the film thickness relationship of t1>t2>t3 is established, the width relationship of w1<w2<w3 is established, wherein these three portions are constituted of any three portions out of four portions at which two first electrode lines which are arranged on the outermost side of the display region and two second electrode lines which are arranged on the outermost side of the display region intersect each other. Further, to be more specific, the first portion and third portion are arranged diagonally within the display region.

Here, although FIG. 24 takes one region 711 in the case of the four-piece manufacturing as the example of the third pattern, it is needless to say that the other regions 712 to 714 in the four-piece manufacturing also possess the similar relationship (feature). Further, it is needless to say that not only in the case of the four-piece manufacturing, the regions 721, 723, 724, 72 in the six-piece manufacturing shown in FIG. 20 and the regions 731, 733, 734, 736, 740, 742, 743 and 745 in the fifteen-piece manufacturing shown in FIG. 21 also possess the similar relationship (feature).

The display device having such a relationship can reduce the image quality irregularities.

Last, the fourth pattern is explained. The fourth pattern is a pattern in which the distribution of the film thickness of the conductive film defines the region 738 shown in FIG. 21. The feature of this fourth pattern is explained in conjunction with FIG. 25.

Figure 25:
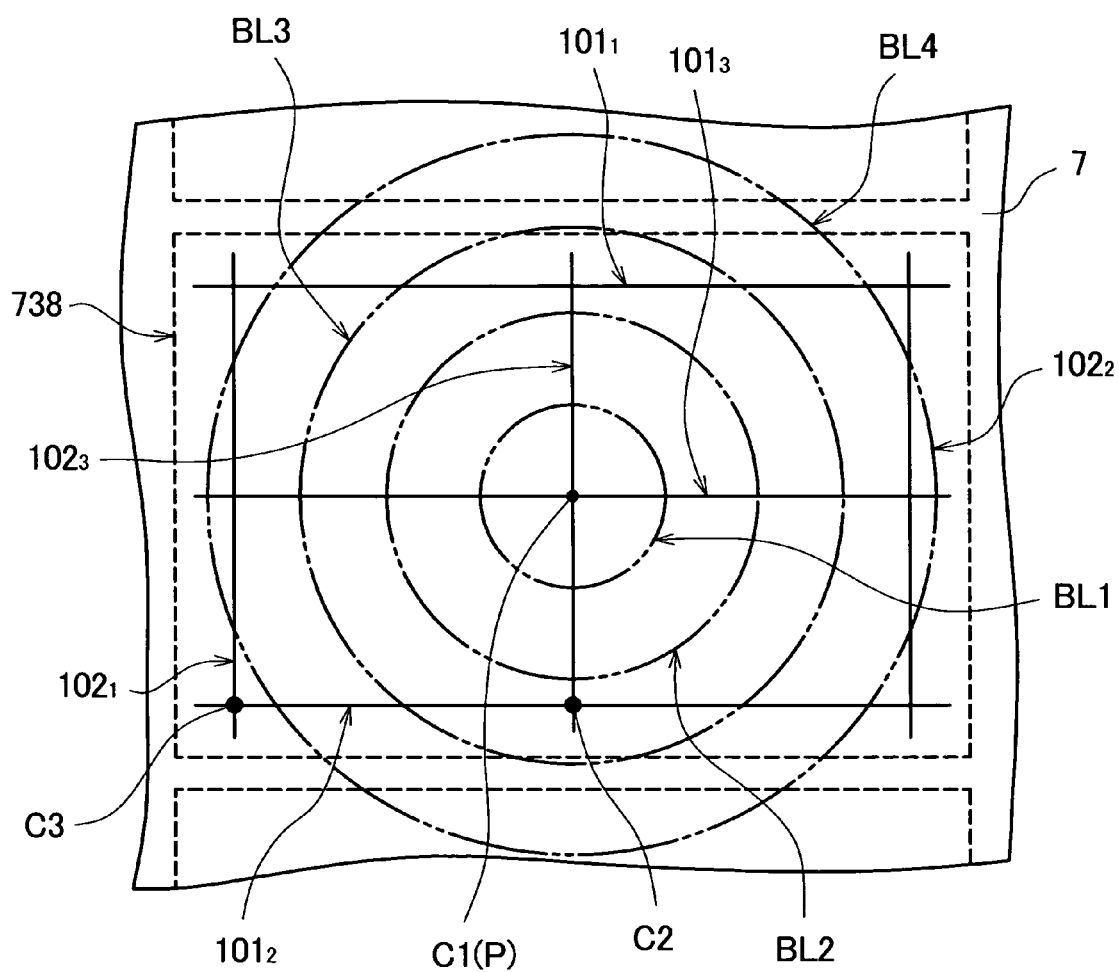
FIG. 25 is a view for explaining a fourth pattern of the film thickness distribution of the conductive film on one substrate.

FIG. 25 is a schematic view for explaining the fourth pattern of the film thickness distribution of the insulating film in one sheet of substrate.

In explaining the fourth pattern of the film thickness distribution of the conductive film, as shown in FIG. 25, one region 738 of the mother glass 7 in the fifteen-piece manufacturing is taken as an example. In FIG. 25, numerals $101_1$, $101_2$ indicate the gate electrode lines which are arranged at an outermost portion in the display region, and numerals $102_1$, $102_2$ indicate the data electrode lines which are arranged at the outermost portion in the display region. That is, a region which is surrounded by these two gate electrode lines $101_1$, $101_2$ and two data electrode lines $102_1$, $102_2$ constitutes the display region which is referred in the present invention. Further, in this display region, a plurality of gate electrode lines and a plurality of data electrode lines not shown in the drawing are arranged besides the gate electrode line $101_3$ which is arranged at a center portion of the display region as well as the data electrode line $102_3$ which is arranged to intersect the gate electrode line $101_3$ at the center portion of the display region.

In the fourth pattern, a film thickness t1 of the conductive film of the gate electrode line at a center portion C1 (that is, the portion where the gate electrode line $101_3$ intersects the data electrode line $102_3$) of the display region within the region 738 shown in FIG. 25 assumes the largest thickness. Further, a film thickness t2 of the conductive film of the gate electrode line at a point C2 where the data electrode line $102_3$ intersects the gate electrode line $101_3$ on the extension of the point C1 in the display region becomes smaller than the film thickness t1 of the conductive film of the gate electrode line at the point C1. Further, a film thickness t3 of the conductive film of the gate electrode line at a point C3 (corner portion) where the outermost gate electrode line $101_1$ in the display region intersects the data electrode line $102_2$ in the display region becomes smaller than the film thickness t2 of the conductive film of the gate electrode line at the point C2.

Further, with respect to the relationship between the film thickness and the width of the conductive film of the gate electrode line in the display device of the present invention in which the plurality of gate electrode lines are arranged on the substrate, the insulating film is arranged above the gate electrode lines, and the plurality of data electrode lines are arranged on the insulating film in a state that the data electrode lines intersect the plurality of gate electrode lines, assuming the film thickness and the width of the conductive film of the gate electrode line at the center (point C1) in the display region of the substrate (region 738) as t1 and w1, the film thickness and the width of the conductive film of the gate electrode line at the portion where the data electrode line intersects the outermost gate electrode line at the center portion as t2 and w2, and the film thickness and the width of the conductive film of the gate electrode line at the corner portion of the gate electrode line in the display region as t3 and w3, the relationship t1>t2>t3 is established and, at the same time, the relationship w1<w2<w3 is established. This is one of the features of the relationship between the film thickness and the width of the insulating film in the fourth pattern.

In this case, it is desirable that the gate electrode lines and data electrode lines are configured such that the products at respective portions, that is t1×w1, t2×w2 and t3×w3 become equal to each other.

To recapitulate the feature of the display device of the fourth pattern, there is provided the display device in which a plurality of first electrode lines such as gate electrode lines, for example, and a plurality of second electrode lines such as data electrode lines, for example, which are arranged above the plurality of first electrode lines in a state that the second electrode lines intersect the first electrode lines by way of an insulating film such as a gate insulating film, for example, are arranged on the substrate and rectangular display regions are formed by the plurality of first electrode lines and the plurality of second electrode lines, wherein at three arbitrary portions on the display region where the first electrode line and the second electrode line intersect each other, assuming a film thickness and a width of a conductive film of the first electrode line in the first portion as t1 and w1, a film thickness and a width of a conductive film of the first electrode line in the second portion as t2 and w2, and a film thickness and a width of a conductive film of the first electrode line in the third portion as t3 and w3, when the film thickness relationship of t1>t2>t3 is established, the width relationship of w1<w2<w3 is established, wherein the first portion is the portion where the first electrode line of the center of the display region intersects the second electrode line, the second portion is the portion where the uppermost or the lowermost first electrode line intersects the second electrode line which intersects the first portion, and the third portion is the portion where the first electrode line of the second portion intersects the second electrode line arranged on the outermost side of the display region.

Here, in FIG. 25, as an example of the fourth pattern, one region 738 in the fifteen-piece manufacturing is shown. However, the present invention is not limited to the fifteen-piece manufacturing, and it is needless to say that the similar relationship (feature) is established also with respect to the center region in case of nine-piece (3 piece×3 piece) manufacturing, for example.

The display device having such relationship can reduce the image quality irregularities.

Here, the display panel can be manufactured by a method substantially equal to the method which is explained in the previously-mentioned embodiment.

Although the above-mentioned embodiment is explained by taking the gate electrode lines as an example, the technical concept of the present invention that when there exist the irregularities with respect to the thickness of the in-plane lines or the in-plane electrodes, the line resistance can be adjusted by changing the line width or the electrode width is applicable to other lines and pixels besides the gate electrode lines.

For example, while the above-mentioned FIG. 3 shows the constitution of each pixel, the lines which are arranged in each pixel are constituted by forming a metal film which becomes a material of the respective lines such as the gate electrode lines or electrodes on a large-sized mother glass using a plasma CVD method whereby, in the same manner as the gate electrode lines, the distribution of metal film shown in FIG. 18 to FIG. 25 is obtained.

In FIG. 3, for example, the data electrode lines 102 also have the metal film distribution substantially equal to the metal film distribution which is explained in conjunction with the gate electrode line. Accordingly, in the first pattern, a film thickness t1 of the conductive film of the data electrode line at a center portion of the outermost gate electrode line $101_2$ in the display region, that is, at a point C1 where the gate electrode line $101_2$ intersects the data signal line $102_3$ assumes the largest thickness. Further, a film thickness t2 of the conductive film of the data electrode line at a point C2 where the gate electrode line $101_2$ intersects the outermost data signal line $102_1$ on the extension of the point C1 in the display region becomes smaller than the film thickness t1 of the conductive film of the data electrode line at the point C1. Further, a film thickness t3 of the conductive film of the data electrode line at a point C3 where the data electrode line $102_1$ in the display region intersects another outermost gate electrode line $101_1$ in the display region becomes smaller than the film thickness t2 of the conductive film of the data electrode line at the point C2.

Further, in the second pattern, a film thickness t1 of the conductive film which becomes the data electrode line at a center portion of the outermost data electrode line $102_2$ in the display region, that is at a point C1 where the outermost data electrode line $102_2$ intersects the gate electrode line $101_3$ assumes the largest value. Further, a film thickness t2 of the conductive film of the data electrode line at a point C2 where the outermost gate electrode line $101_1$ intersects the outermost data electrode line $102_2$ on the extension of the point C1 in the display region becomes smaller than the film thickness t1 of the conductive film of the data electrode line at the point C1. Further, a film thickness t3 of the conductive film of the data electrode line at a point C3 where the gate electrode line $101_1$ in the display region intersects another outermost data electrode line $102_1$ in the display region is set smaller than the film thickness t2 of the conductive film of the data electrode line at the point C2.

Further, in the third pattern, a film thickness t1 of the conductive film of the data electrode line at a point C1 (a corner portion) where the outermost gate electrode line $101_2$ and the data signal line $102_2$ in the display region intersect each other assumes a largest value. Further, a film thickness t2 of the conductive film of the data electrode line at a point C2 where the outermost gate electrode line $101_2$ intersects another outermost data electrode line $102_1$ on the extension of the point C1 in the display region is set smaller than the film thickness t1 of the conductive film of the data electrode line at the point C1. Further, a film thickness t3 of the conductive film of the data electrode line at a point C3 which is positioned diagonal to the point C1 in the display region is set smaller than the film thickness t2 of the conductive film of the data electrode line at a point C2.

Further, in the fourth pattern, a film thickness t1 of the conductive film of the data electrode line at the center C1 in the display region (that is, a portion where the gate electrode line $101_3$ and the data electrode line $102_3$ intersect each other) assumes a largest value. Further, a film thickness t2 of the conductive film of the data electrode line at a point C2 where the data electrode line $102_3$ intersects the gate electrode line $101_3$ on the extension of the point C1 in the display region is set smaller than the film thickness t1 of the conductive film of the data electrode line at the point C1. Further, a film thickness t3 of the conductive film of the data electrode line at a point C3 (a corner portion) where the outermost gate electrode line $101_1$ and the data electrode line $102_2$ intersect each other on the display region is set smaller than a film thickness t2 of the data electrode line at the point C2.

Figure 26:
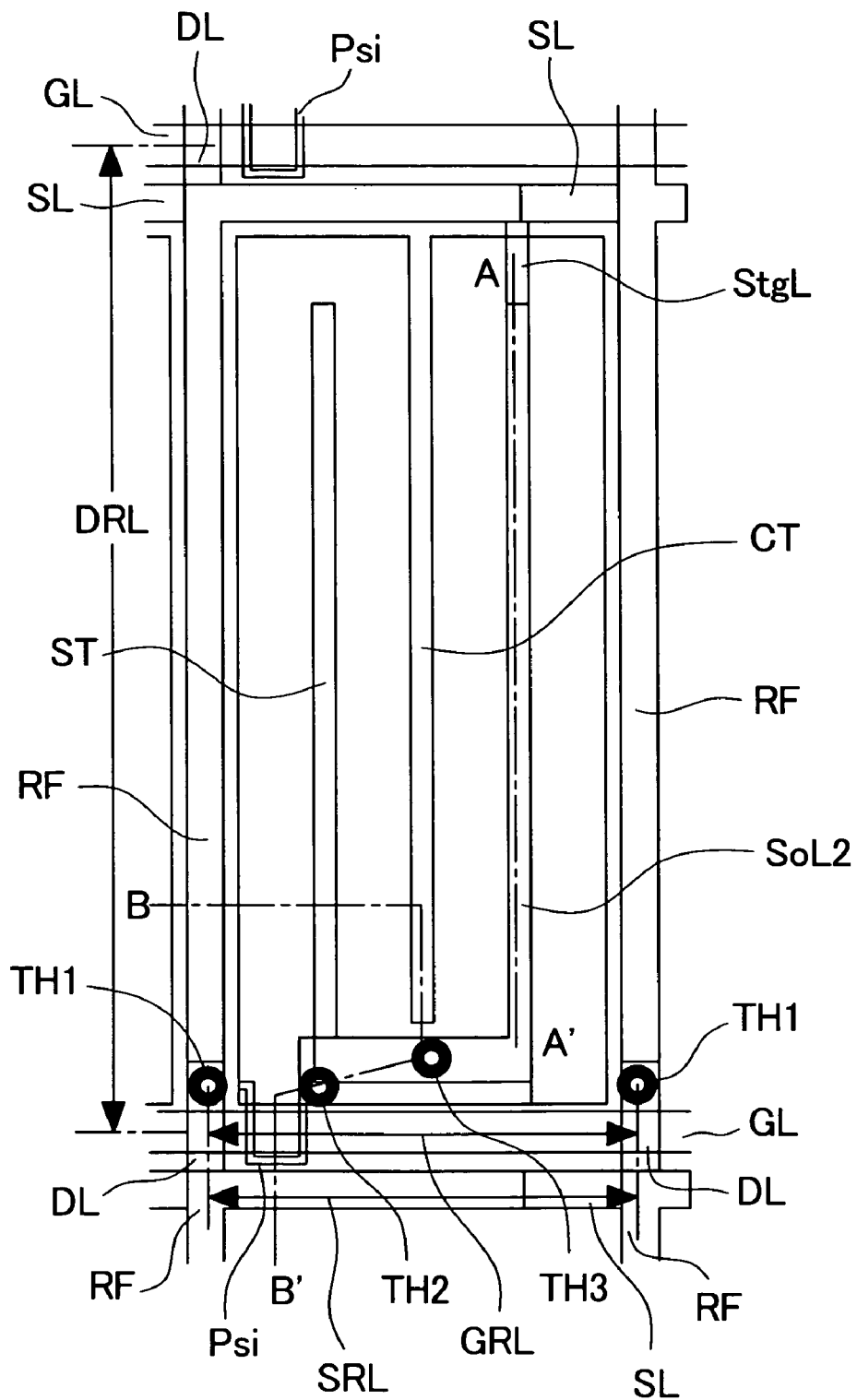
FIG. 26 is a schematic view showing the pixel constitution of the liquid crystal display device according to the present invention.
Figure 27:
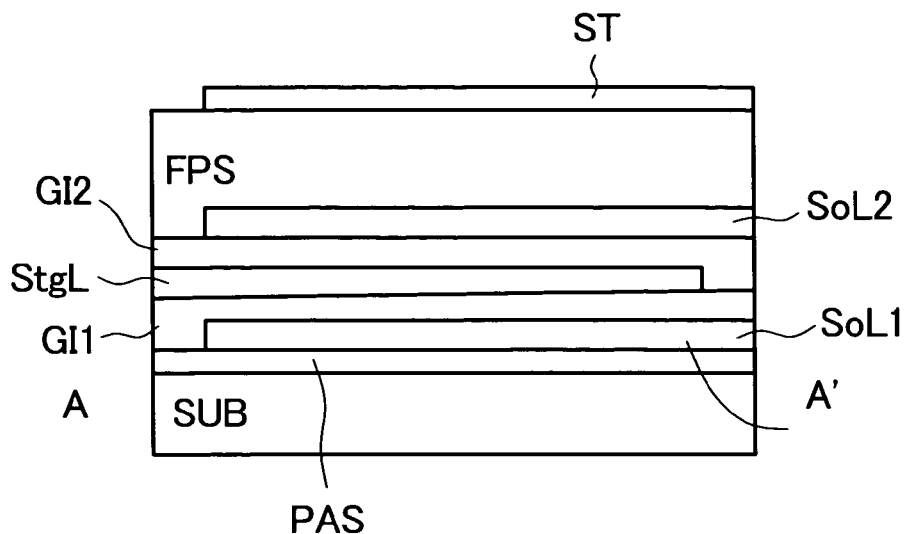
FIG. 27 is a view showing a cross section taken along a line A-A' in FIG. 26.

FIG. 26 shows the pixel constitution different from the pixel constitution shown in FIG. 3, wherein a storage line SL is arranged parallel to the gate electrode line GL. Here, FIG. 27 is a cross-sectional view taken along a line A-A' in FIG. 26 and FIG. 28 is a cross-sectional view taken along a line B-B' in FIG. 26.

The pixel structure shown in FIG. 26 is briefly explained. In FIG. 26, a pixel is constituted corresponding to a region which is surrounded by two data electrode lines DL and two gate electrode lines GL, wherein the storage line SL is arranged parallel to the upper gate electrode line GL. Further, a transistor is formed at a portion corresponding to an intersecting portion of the gate electrode line GL and the data electrode line DL, wherein a source electrode line SoL2 which is connected to the transistor via a through hole TH2 and a pixel electrode ST which is connected to the transistor via a through hole TH3 are arranged. A common electrode CT is arranged in a state that the common electrode CT forms a comb-teeth shape engaged with the pixel electrode ST, wherein the common electrode CT is arranged above the gate electrode line GL, the data electrode line DL and the storage electrode line SL in an overlapped manner. Further, a reflection layer RF is arranged above the gate electrode line GL and a portion of an upper portion of the storage electrode line SL in an overlapped manner. FIG. 27 is a cross-sectional view taken along a line A-A' in FIG. 26 wherein, an auxiliary capacitance forming portion is formed by the constitution shown in the A-A' cross section. A conductive layer SoL1 which is connected to a semiconductor layer which forms the transistor is arranged below a StgL portion which is extended from the storage electrode line SL and, further, the source electrode line SoL2 is arranged above the StgL portion thus forming the auxiliary capacitance. Here, the pixel electrode is arranged above the auxiliary capacitance forming portion in an overlapped manner.

Figure 28:
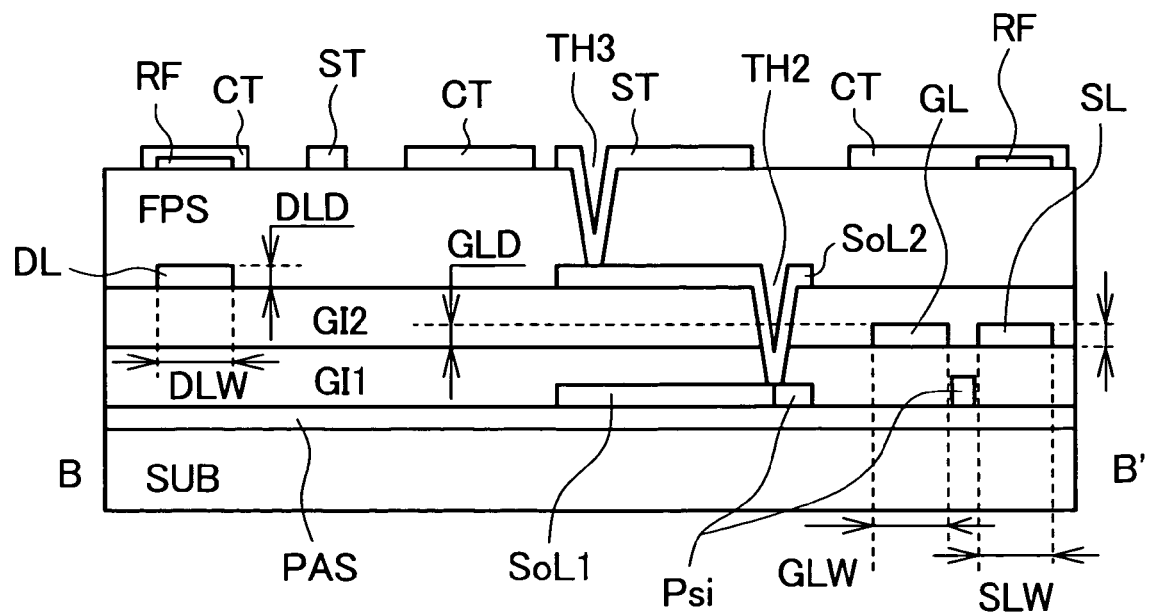
FIG. 28 is a view showing a cross section taken along a line B-B' in FIG. 27.

FIG. 28 is a cross-sectional view taken along a line B-B' in FIG. 26 and shows the gate electrode line GL, the data electrode line DL, the storage electrode line SL, and a cross section of the transistor portion. As shown in FIG. 28, a common electrode CT is arranged above the gate electrode line GL and the storage electrode line SL in an overlapped manner and, further, a reflection layer RF is arranged on a lower portion of the common electrode CT arranged above the storage electrode line SL. Further, above the data electrode line DL, the reflection layer RF and the common electrode CT which covers the reflection layer are arranged in a state that the reflection layer RF and the common electrode CT are overlapped to the data electrode line. The transistor portion is formed by arranging a semiconductor layer Psi below the gate electrode line GT in a state that the semiconductor layer Psi strides over the gate electrode line GT.

The storage line is also constituted by forming a metal film which becomes a material of respective lines or electrodes using large-sized mother glass by a target spattering method, for example, in the same manner as the gate electrode lines. Accordingly, in the same manner as the gate electrode lines, the storage line exhibits the metal film distribution shown in FIG. 18 to FIG. 25. Hereinafter, the explanation is made on the premise of the constitution in which the storage line is arranged parallel to the gate electrode line in each pixel as shown in FIG. 26.

As shown in FIG. 26, for example, the storage line SL also assumes the metal film distribution similar to the metal film distribution explained with respect to the gate electrode lines and hence, in the first pattern, a film thickness t1 of the conductive film of the storage line at a center portion of the storage line which corresponds to the outermost gate electrode line $101_2$ in the display region, that is, at a point C1 where the storage line intersects the data signal line $102_3$ assumes the largest thickness. Further, a film thickness t2 of the conductive film of the storage line at a point C2 where the storage line intersects the outermost data signal line $102_1$ on the extension of the point C1 in the display region becomes smaller than the film thickness t1 of the conductive film of the storage line at the point C1. Further, a film thickness t3 of the conductive film of the storage line at a point C3 where the storage line which corresponds to the pixel in which the data electrode line $102_1$ intersects another outermost gate electrode line $101_1$ in the display region intersects the data electrode line becomes smaller than the film thickness t2 of the conductive film of the storage line at the point C2.

Further, in the second pattern, a film thickness t1 of the conductive film which becomes the storage line at a center portion of the outermost data electrode line $102_2$ in the display region, that is, at a point C1 at which the outer most data electrode line $102_2$ intersects the storage line assumes the largest value. Further, a film thickness t2 of the conductive film of the storage line at a point C2 where the outermost storage line intersects the outermost data electrode line $102_2$ on the extension of the point C1 in the display region becomes smaller than the film thickness t1 of the conductive film of the storage line at the point C1. Further, a film thickness t3 of the conductive film of the storage line at a point C3 where the storage line in the display region intersects another outermost data electrode line $102_1$ in the display region is set smaller than the film thickness t2 of the conductive film of the storage line at the point C2.

Further, in the third pattern, a film thickness t1 of the conductive film of the storage line at a point C1 (a corner portion) where the storage line which corresponds to the outermost gate electrode line $101_2$ in the display region and the data signal line $102_2$ intersect each other assumes a largest value. Further, a film thickness t2 of the conductive film of the storage line at a point C2 where the storage line intersects another outermost data electrode line $102_1$ on the extension of the point C1 in the display region is set smaller than the film thickness t1 of the conductive film of the storage line at the point C1. Further, a film thickness t3 of the conductive film of the storage line at a point C3 which is positioned diagonal to the point C1 in the display region is set smaller than the film thickness t2 of the conductive film of the storage line at a point C2.

Further, in the fourth pattern, a film thickness t1 of the conductive film of the storage line at the center C1 in the display region (that is, a portion where the storage line and the data electrode line $102_3$ intersect each other) assumes a largest value. Further, a film thickness t2 of the conductive film of the storage line at a point C2 where the data electrode line $102_3$ intersects the storage line on the extension of the point C1 in the display region is set smaller than the film thickness t1 of the conductive film of the storage line at the point C1. Further, a film thickness t3 of the conductive film of the storage line at a point C3 (a corner portion) where the outermost storage line and the data electrode line $102_2$ intersect each other on the display region is set smaller than a film thickness t2 of the conductive film of the storage line at the point C2.

Further, in the so-called IPS-type liquid crystal display device shown in FIG. 26, for example, a common line which connects the common electrodes of the respective pixels which are arranged on the TFT substrate side are arranged parallel to the gate electrode line, for example. Accordingly, the above-mentioned description with respect to the storage lines is also applicable to the common line.

The above-mentioned embodiments are limited to the case shown in FIG. 13. That is, film thickness distribution of the formed conductive film is measured (step 602), the widths of the gate electrode lines are determined in response to the film thicknesses of the respective regions of the conductive film and the drawing data is corrected (for making the cross-sectional areas of the respective gate electrode lines become equal to each other: step 603) and hence, the intended widths of the gate electrode lines agree with the widths of the gate electrode lines which are formed by forming the gate electrode lines by etching the conductive film and, thereafter, by removing the resist (step 605).

In an embodiment explained hereinafter, the explanation is made with respect to a case in which in-plane irregularities exist in an etching quantity in a process for etching the conductive film in step 605 shown in FIG. 13 and hence, the widths of the gate electrode lines are not uniform.

In the manufacturing steps shown in FIG. 13, there may be a case that the widths of the electrode lines which are formed in step 605 are deviated from the intended widths of the gate electrode lines in step 603.

Figure 29:
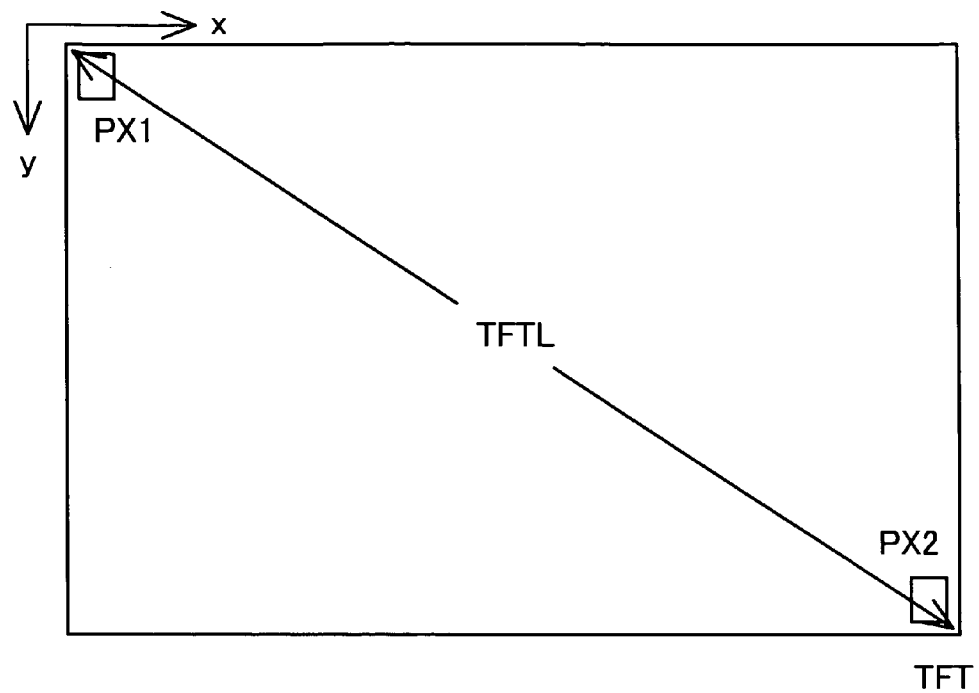
FIG. 29 is a view showing the positions of the pixels in the present invention.

In FIG. 29, with respect to two pixels PX1, PX2 which are arranged at apexes of a TFT array having diagonal size of 80 cm, in spite of the fact that film thicknesses of conductive films of gate electrode lines are made substantially equal, to compare widths GLW1, GLW2 of the conductive films of the gate electrode lines which are arranged diagonally, the width GLW2 of the conductive film of one gate electrode line is set larger than the width GLW1 of the conductive film of another gate electrode line by 2.6 μm. To explain this fact in conjunction with FIG. 13, since the measurement results of the film thicknesses of the conductive films of the gate electrode lines in the PX1 and PX2 are equal in step 602, although the intended widths of the gate electrode lines of the PX1 and PX2 which are determined in step 603 become equal, the in-plane irregularities arise with respect to the etching quantity in the process for etching the conductive film in step 605 and hence, it is recognized that the line width GLW2 is formed wider than the line width GLW1 by approximately 2.6 μm.

Assuming that a change of etching quantity in the process for etching the conducive film in FIG. 13 gradually takes place in plane, positions of PX1, PX2 arranged at diagonal positions of the TFT array in FIG. 29 generate a maximum value in difference of the in-plane etching quantity and the above-mentioned maximum value is assumed to be 2.6 μm. In FIG. 29, in either one of the PX1 and PX2, when the widths of the gate electrode lines which are intended in step 603 agree to the width of the gate electrode lines which are formed in step 605, on the other hand, the widths of the gate electrode lines which are intended in step 603 differ from the width of the gate electrode lines which are formed in step 605 by 2.6 μm. In the above-mentioned arbitrary pixel in the TFT array having a diagonal size of 80 cm shown in FIG. 29, the maximum value of the difference between the intended width of the gate electrode line in step 603 shown in FIG. 13 and the width of the gate electrode line formed in step 605 becomes 2.6 μm or less.

Accordingly, there exists a possibility that the difference between the widths of the gate electrode lines in two pixels PX1, PX2 which are spaced apart by TFTL(cm) within the TFT array shown in FIG. 29 becomes, even when the formed film thicknesses are equal in both pixels PX1, PX2, (2.6 μm÷80 cm)×TFTL(cm) at maximum. That is, it is necessary to take the following phenomenon as etching irregularities. That is, even when the gate electrode lines are formed in the manufacturing steps shown in FIG. 13 to set the line resistances of two pixels PX1, PX2 to a fixed value, the formed gate electrode lines give rise to errors corresponding to the difference in the width of the gate electrode line which amounts to (2.6 μm÷80 cm)×TFTL(cm) at maximum.

In the TFT array of the diagonal size of TFTL (cm) having the pixel structure shown in FIG. 26 to FIG. 28, with respect to two pixels PX1, PX2 shown in FIG. 9, as shown in FIG. 10, the pixel PX2 is formed with the thickness larger than the thickness of the pixel PX1 at the time of forming the conductive film of the gate electrode line.

Figure 30:
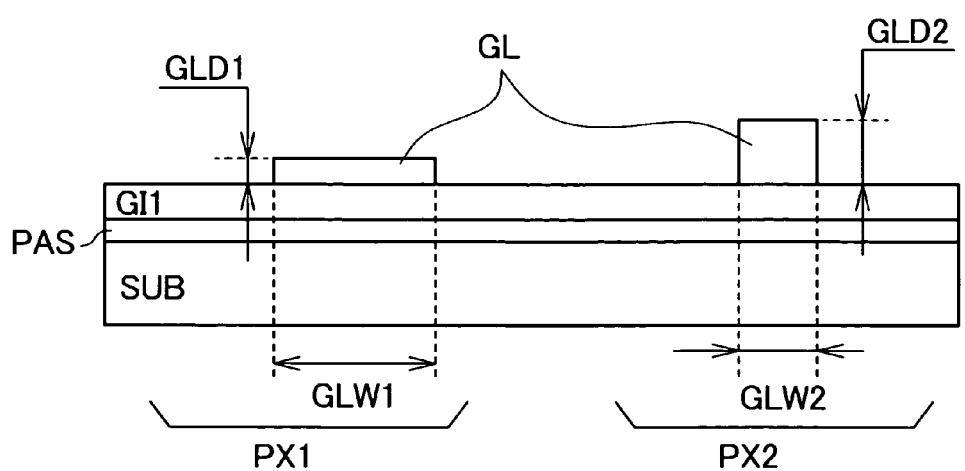
FIG. 30 is a view showing cross-sectional shapes of lines at positions of respective pixels in FIG. 29.

As shown in FIG. 30, provided that the film thickness GLD2 of the conductive film of the gate electrode line of the pixel PX2 is larger than the film thickness GLD1 of the conductive film of the gate electrode line of the pixel PX1 on the TFT array of the diagonal size of TFTL(cm), when CAD layout data is updated to set the line width GLW1 of the gate electrode line of the pixel PX1 larger than the line width GLW2 of the gate electrode line of the pixel PX2 and the direct drawing is performed to form the lines, the result turns out to be GLW1>GLW2−(2.6 μm÷80 cm)×TFTL(cm) and hence, the line resistance becomes fixed by taking the irregularities of etching quantity into consideration.

Figure 31:
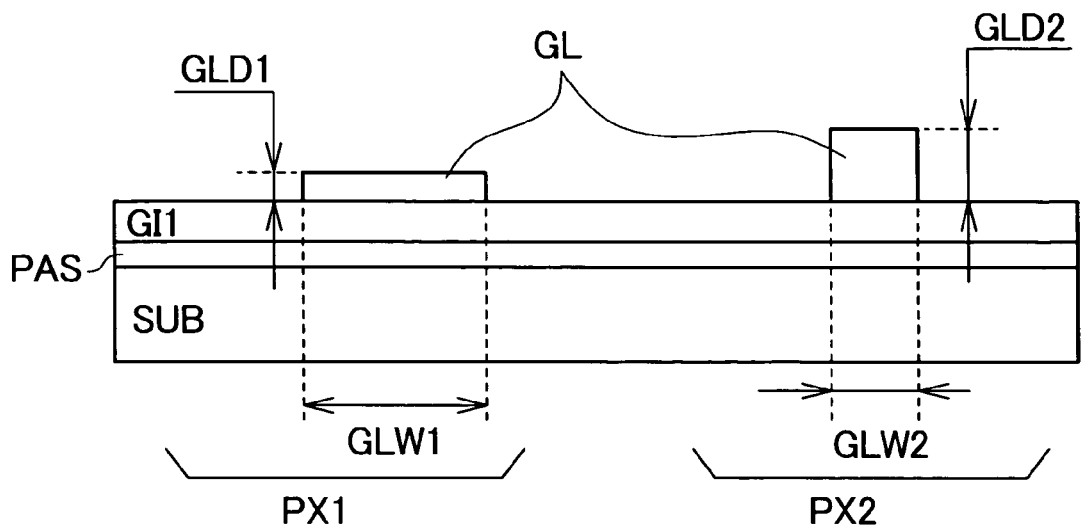
FIG. 31 is a view showing cross-sectional shapes of lines at positions of respective pixels in FIG. 29.

Further, in FIG. 31, provided that the film thickness GLD2 of the conductive film of the gate electrode line of the pixel PX2 is larger than the film thickness GLD1 of the conductive film of the gate electrode line of the pixel PX1 on the TFT array of the diagonal size of TFTL(cm), when CAD layout data is updated to set the cross-sectional areas of the scanning lines of the pixels PX1, PX2 equal and the direct drawing is performed to form the lines, the result turns out to be GLD1×(GLW1−(2.6 μm÷80 cm)×TFTL(cm))<GLD2×GLW2<GLD1×(GLW1+(2.6 μm÷80 cm)×TFTL(cm)) and hence, the line resistance becomes fixed to take the irregularities of etching quantity into consideration.

Figure 32:
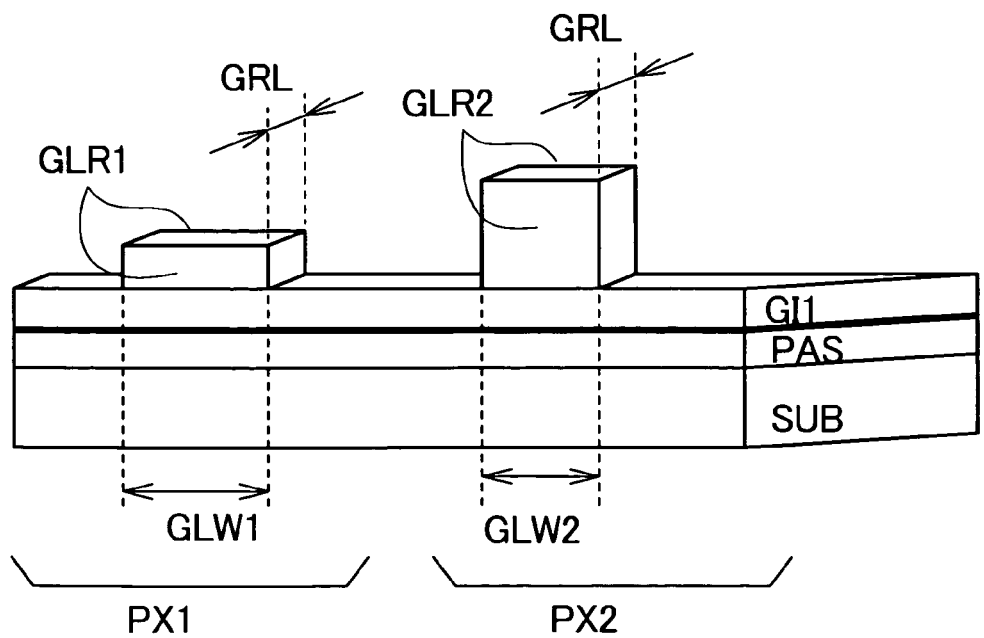
FIG. 32 is a view for explaining a line resistance of the present invention.

As shown in FIG. 32, when a gate electrode line length GRL portion of the gate electrode line of the pixel PX1 in the TFT array is sampled and the resistance value GLR1 in a state that two cross sections orthogonal to the gate electrode line direction define both ends of the resistance is measured and, at the same time, when a gate electrode line length GRL portion of the gate electrode line of the pixel PX2 is sampled and the resistance value GLR2 in a state that two cross sections orthogonal to the gate electrode line direction define both ends of the resistance is measured, the relationship GLR1×(1−(2.6 μm÷80 cm)×TFTL(cm)+GLW1(μm))<GLR2×GLR1×(1+(2.6 μm÷80 cm)×TFTL(cm)÷GLW1 (μm)) is obtained. Accordingly, it is confirmed that the line resistance is set to a fixed value by taking the irregularities of etching quantity into consideration. The gate electrode line length GRL is a distance between bisectors of signal line widths arranged at both ends of the pixel PX1 or PX2 as shown in FIG. 26.

Figure 33:
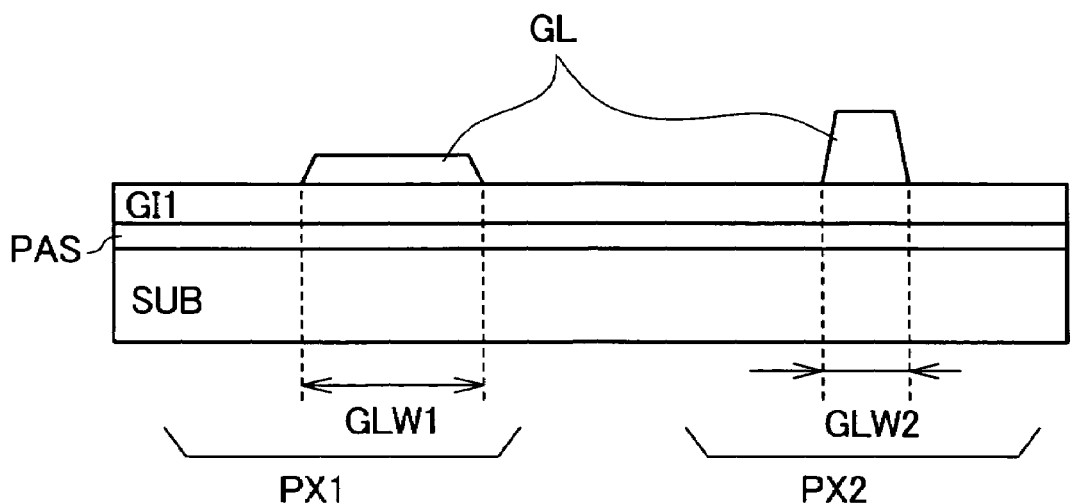
FIG. 33 is a view showing further cross-sectional shapes of the lines of the present invention.
Figure 34:
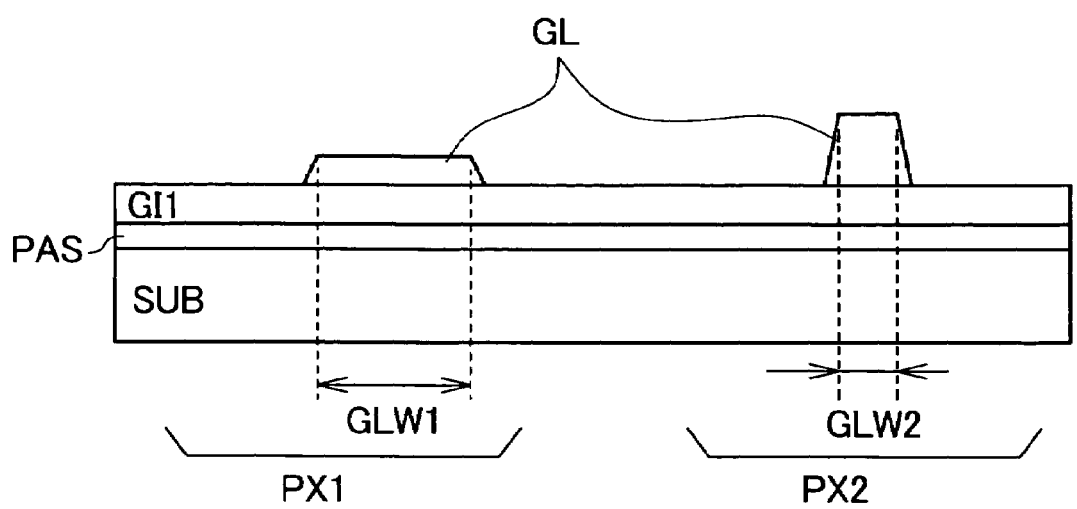
FIG. 34 is a view showing other cross-sectional shapes of the lines of the present invention.

The cross-sectional shape of the gate electrode line is not a rectangular shape and becomes a trapezoidal shape which has a narrow upper side and a wide lower side as shown in FIG. 33 and FIG. 34. Here, as shown in FIG. 33, when the line width GLW1 of the gate electrode line of the pixel PX1 is measured using a lower side length of the trapezoidal shape, the line width GLW2 of the gate electrode line of the pixel PX1 is set using a lower side length of the trapezoidal shape. Alternatively, as shown in FIG. 34, when the line width GLW1 of the gate electrode line of the pixel PX1 is measured using an upper side length of the trapezoidal shape, the line width GLW2 of the gate electrode line of the pixel PX1 is set using an upper side length of the trapezoidal shape.

Another example is shown with respect to the constitution of the gate electrode lines. The cross section of the gate electrode line may be constituted, as shown in FIG. 35 and FIG. 36, of three layers which include a conductive layer having a small resistance value per unit length and adhesive layers which are formed on upper and lower surfaces of the conductive layer for enhancing an adhesive force for adhering gate electrode with layers above and below the gate electrode.

Figure 35:
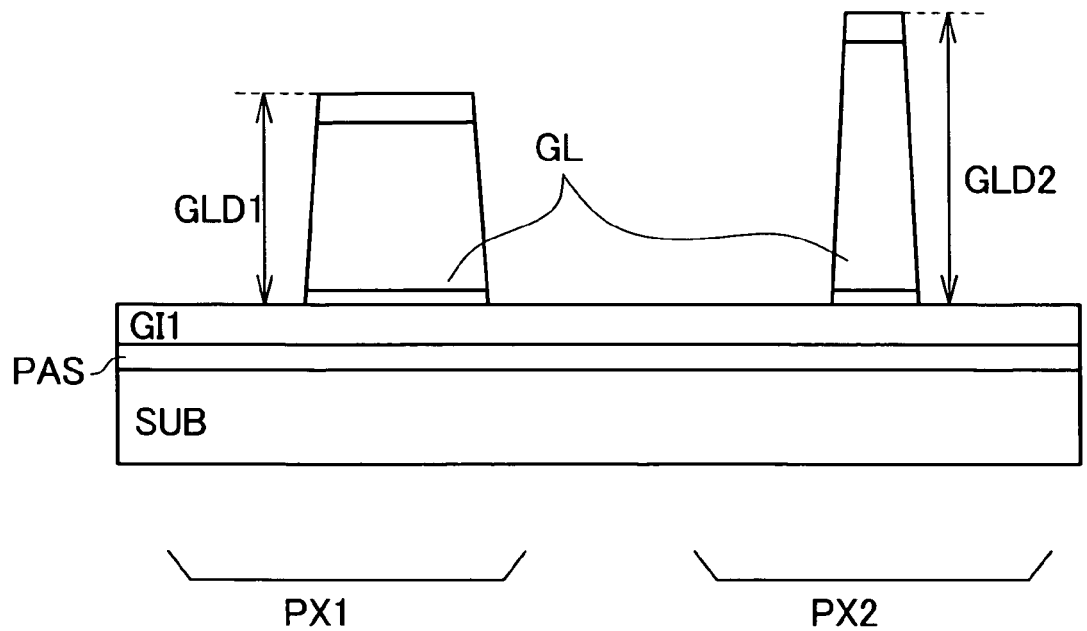
FIG. 35 is a view showing still further cross-sectional shapes of the lines of the present invention.
Figure 36:
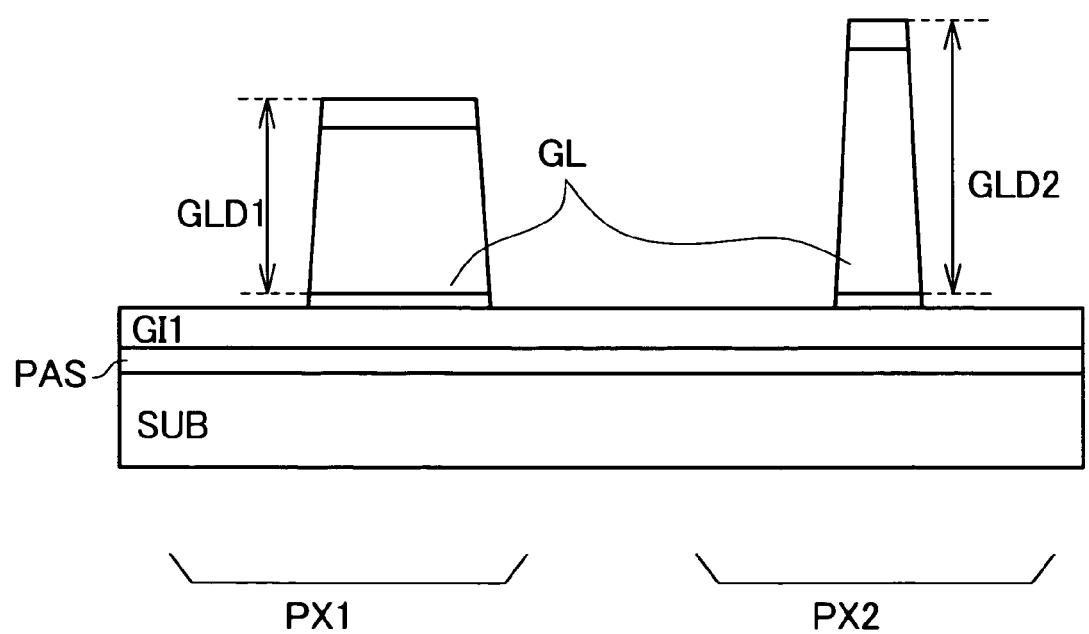
FIG. 36 is a view showing still further cross-sectional shapes of the lines of the present invention.

Here, as shown in FIG. 35, when the film thickness GLD1 of the conductive film of the gate electrode line of the pixel PX1 is measured using a total thickness of three layers, the film thickness GLD2 of the conductive film scanning line of the gate electrode line of the pixel PX2 is also measured using a total thickness of three layers. Alternatively, as shown in FIG. 36, when the film thickness GLD1 of the conductive film of the gate electrode line of the pixel PX1 is measured using a thickness of the conductive layer, the film thickness GLD2 of the scanning line of the conductive film of the gate electrode line of the pixel PX2 is also measured using a thickness of the conductive layer.

Although the explanation has been made by taking the gate electrode lines as the example heretofore, the same goes for the data electrode lines, the storage lines and common electrode lines.

To explain a further embodiment of the present invention hereinafter, in the liquid crystal display device which includes the TFT array of the present invention, with respect to two arbitrary pixels on the TFT array of the diagonal size TFTL (cm), the line width in the pixel having the small line thickness assumes a value which is obtained by subtracting (2.6 μm×80 cm)×TFTL(cm) from the line width in the pixel having the large line thickness.

Further, to describe a further embodiment of the present invention hereinafter, in the liquid crystal display device which includes the TFT array of the present invention, with respect to two arbitrary pixels on the TFT array of the diagonal size TFTL (cm), an absolute value of a value which is obtained by subtracting 1 from a value obtained by dividing a line cross-sectional area of one pixel with a line cross-sectional area of another pixel is a value which is obtained by dividing (2.6 μm×80 cm)×TFTL(cm) with the line width or less.

Further, to describe a further embodiment of the present invention hereinafter, in the liquid crystal display device which includes the TFT array of the present invention, with respect to two arbitrary pixels on the TFT array of the diagonal size TFTL (cm), an absolute value of a value which is obtained by subtracting 1 from a value obtained by dividing a line resistance value of one pixel with a line resistance value of another pixel is a value which is obtained by dividing (2.6 μm×80 cm)×TFTL(cm) with the line width or less.

Although the present invention has been specifically explained in conjunction with the embodiments, it is needless to say that the present invention is not limited by the embodiments and various modifications can be made without departing from the gist of the present invention.

What is claimed is:

1. A display device comprising:
a plurality of first electrode lines and a plurality of second electrode lines which are arranged above said plurality of first electrode lines and intersected with said first electrode lines through an insulating film on a substrate, and a rectangular display region is formed by said plurality of first electrode lines and said plurality of second electrode lines,
wherein at three arbitrary portions on said display region where said first electrode line and said second electrode line intersect each other,
a film thickness and a width of a conductive film of said first electrode line in said first portion as $t_1$ and $w_1$, a film thickness and a width of a conductive film of said first electrode line in said second portion as $t_2$ and $w_2$, a film thickness and a width of a conductive film of said first electrode line in said third portion as $t_3$ and $w_3$, $t_1 > t_2 > t_3$ and $w_1 < w_2 < w_3$ to form a cross-sectional area $t_1 \times w_1$ of said first gate electrode line in said first portion, a cross-sectional area $t_2 \times w_2$ of said first gate electrode line in said second portion and a cross-sectional area $t_3 \times w_3$ of said first gate electrode line in said third portion substantially equal to one another, and
said first portion, said second portion and said third portion are formed in the same layer.

2. A display device according to claim 1, wherein a product of $t_1$ and $w_1$, a product of $t_2$ and $w_2$, and a product of $t_3$ and $w_3$ are made equal to each other.

3. A display device according to claim 1, wherein
said first portion is a center portion of said first electrode line which is arranged on an uppermost side of said display region,
said second portion is a portion where said first electrode line on the uppermost side intersects said second electrode line which is arranged on an outermost side of said display region, and
said third portion is a portion where said second electrode line at the second portion intersects said first electrode line which is arranged on a lowermost side of said display region.

4. A display device according to claim 1, wherein
said first portion is a center portion of said first electrode line which is arranged on a lowermost side of said display region,
said second portion is a portion where said first electrode line on the lowermost side intersects said second electrode line which is arranged on an outermost side of said display region, and
said third portion is a portion where the second electrode line at said second portion intersects said first electrode line which is arranged on an uppermost side of said display region.

5. A display device according to claim 1, wherein
said first portion is a center portion of said second electrode line which is arranged on a leftmost side of said display region,
said second portion is a portion where said second electrode line on the leftmost side intersects said first electrode line which is arranged on an uppermost side or a lowermost side of said display region, and said third portion is a portion where said first electrode line at said second portion intersects said second electrode line which is arranged on a rightmost side of said display region.

6. A display device according to claim 1, wherein
said first portion is a center portion of said second electrode line which is arranged on a rightmost side of said display region,
said second portion is a portion where said second electrode line on the rightmost side intersects said first electrode line which is arranged on an uppermost side or a lowermost side of said display region, and
said third portion is a portion where said first electrode line at said second portion intersects said second electrode line which is arranged on a leftmost side of said display region.

7. A display device according to claim 1, wherein said three portions are three portions out of four portions where two first electrode lines which are arranged on an outermost side of said display region and two second electrode lines which are arranged on the outermost side of said display region intersect each other.

8. A display device according to claim 7, wherein said first portion and said third portion are positioned diagonally within said display region.

9. A display device according to claim 1, wherein
said first portion is a portion where said first electrode line and said second electrode line intersect each other at a center portion of said display region,
said second portion is a portion where said first electrode line on an uppermost side or a lowermost side of said display region intersects said second electrode line which intersects at said first portion, and
said third portion is a portion where said first electrode line at said second portion intersects said second electrode line which is arranged on an outermost side of said display region.

10. A display device comprising:
a plurality of first electrode lines and a plurality of second electrode lines which are arranged above said plurality of first electrode lines and intersected with said first electrode lines through an insulating film on a substrate, and a rectangular display region is formed by the plurality of first electrode lines and the plurality of second electrode lines,
wherein at three arbitrary portions on said display region where said first electrode line and said second electrode line intersect each other,
a film thickness and a width of a conductive film of said first electrode line in said first portion as t1 and w1, a film thickness and a width of a conductive film of said second electrode line in the second portion as t2 and w2, a film thickness and a width of a conductive film of said second electrode line in said third portion as t3 and w3, t1>t2>t3 and w1<w2<w3 to form a cross-sectional area t1×w1 of said first gate electrode line in said first portion, a cross-sectional area t2×w2 of said second gate electrode line in said second portion and a cross-sectional area t3×w3 of said second gate electrode line in said third portion substantially equal to one another, and
said first portion, said second portion and said third portion are formed in the same layer.

11. A display device according to claim 10, wherein a product of t1 and w1, a product of t2 and w2, and a product of t3 and w3 are made equal to each other.

12. A display device according to claim 10, wherein
said first portion is a center portion of said first electrode line which is arranged on an uppermost side of said display region,
said second portion is a portion where said first electrode line on the uppermost side intersects said second electrode line which is arranged on an outermost side of said display region, and
said third portion is a portion where said second electrode line at said second portion intersects said first electrode line which is arranged on a lowermost side of said display region.

13. A display device according to claim 10, wherein
said first portion is a center portion of said first electrode line which is arranged on a lowermost side of said display region,
said second portion is a portion where said first electrode line on the lowermost side intersects said second electrode line which is arranged on an outermost side of said display region, and
said third portion is a portion where said second electrode line at said second portion intersects said first electrode line which is arranged on an uppermost side of the display region.

14. A display device according to claim 10, wherein
said first portion is a center portion of said second electrode line which is arranged on a leftmost side of said display region,
said second portion is a portion where said second electrode line on the leftmost side intersects said first electrode line which is arranged on an uppermost side or a lowermost side of said display region, and
said third portion is a portion where said first electrode line at said second portion intersects said second electrode line which is arranged on a rightmost side of said display region.

15. A display device according to claim 10, wherein
said first portion is a center portion of said second electrode line which is arranged on a rightmost side of said display region,
said second portion is a portion where said second electrode line on the rightmost side intersects said first electrode line which is arranged on an uppermost side or a lowermost side of said display region, and
said third portion is a portion where the first electrode line at said second portion intersects said second electrode line which is arranged on a leftmost side of said display region.

16. A display device according to claim 10, wherein said three portions are three portions out of four portions where two first electrode lines which are arranged on an outermost side of said display region and two second electrode lines which are arranged on said outermost side of said display region intersect each other.

17. A display device according to claim 16, wherein said first portion and said third portion are positioned diagonally within said display region.

18. A display device according to claim 10, wherein
said first portion is a portion where said first electrode line and said second electrode line intersect each other at a center portion of said display region,
said second portion is a portion where said first electrode line on an uppermost side or a lowermost side of said display region intersects said second electrode line which intersects at said first portion, and said third portion is a portion where said first electrode line at said second portion intersects said second electrode line which is arranged on an outermost side of said display region.

19. A display device according to claim 1, wherein said first portion, said second portion and said third portion are formed on the same level from the substrate.

20. A display device according to claim 10, wherein said first portion, said second portion and said third portion are formed on the same level from the substrate.

* * * * *

UNITED STATES PATENT AND TRADEMARK OFFICE
CERTIFICATE OF CORRECTION

PATENT NO. : 7,595,506 B2  Page 1 of 1
APPLICATION NO. : 11/375108
DATED : September 29, 2009
INVENTOR(S) : Ohara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 275 days.

Signed and Sealed this

Twenty-eighth Day of September, 2010

David J. Kappos
*Director of the United States Patent and Trademark Office*